(12) United States Patent
Kagawa

(10) Patent No.: US 9,894,817 B2
(45) Date of Patent: Feb. 13, 2018

(54) COMPOSITE ELECTROMAGNETIC-WAVE-ABSORBING SHEET

(71) Applicant: Seiji Kagawa, Koshigaya (JP)

(72) Inventor: Seiji Kagawa, Koshigaya (JP)

( * ) Notice: Subject to any disclaimer, the term of this patent is extended or adjusted under 35 U.S.C. 154(b) by 655 days.

(21) Appl. No.: 14/361,612

(22) PCT Filed: Nov. 29, 2012

(86) PCT No.: PCT/JP2012/080886
§ 371 (c)(1),
(2) Date: May 29, 2014

(87) PCT Pub. No.: WO2013/081043
PCT Pub. Date: Jun. 6, 2013

(65) Prior Publication Data
US 2015/0027771 A1    Jan. 29, 2015

(30) Foreign Application Priority Data
Nov. 30, 2011    (JP) .................................. 2011-261780

(51) Int. Cl.
*H05K 9/00* (2006.01)
*H01Q 17/00* (2006.01)
(Continued)

(52) U.S. Cl.
CPC ........... *H05K 9/0083* (2013.01); *B32B 25/02* (2013.01); *B32B 25/08* (2013.01); *B32B 27/08* (2013.01);
(Continued)

(58) Field of Classification Search
CPC ......... B32B 25/02; B32B 25/08; B32B 27/08; B32B 27/20; B32B 27/36; B32B 2250/02;
(Continued)

(56) References Cited

U.S. PATENT DOCUMENTS 5,458,951 A    10/1995    Kagawa
5,593,632 A    1/1997    Kagawa
(Continued)

FOREIGN PATENT DOCUMENTS

CN    1708214 A    12/2005
CN    1723748 A    1/2006
(Continued)

OTHER PUBLICATIONS

JP 2005251918 A; Machine Translation.*
(Continued)

*Primary Examiner* — Maria V Ewald
*Assistant Examiner* — Travis M Figg
(74) *Attorney, Agent, or Firm* — Birch, Stewart, Kolasch & Birch, LLP

(57) ABSTRACT

A composite electromagnetic-wave-absorbing sheet comprising (a) a first electromagnetic-wave-absorbing film 10a comprising a plastic film 11, and a single- or multi-layer thin metal film formed on at least one surface of the plastic film 12, the thin metal film 12 being provided with large numbers of substantially parallel, intermittent, linear scratches 122 with irregular widths and irregular intervals in plural directions, and (b) a second electromagnetic-wave-absorbing film 20 composed of a resin or a rubber in which magnetic particles or non-magnetic, conductive particles are dispersed.

7 Claims, 32 Drawing Sheets

(51) Int. Cl.
*B32B 25/02* (2006.01)
*B32B 25/08* (2006.01)
*B32B 27/08* (2006.01)
*B32B 27/20* (2006.01)
*B32B 27/36* (2006.01)
*H01F 1/26* (2006.01)

(52) U.S. Cl.
CPC .............. *B32B 27/20* (2013.01); *B32B 27/36* (2013.01); *H01F 1/26* (2013.01); *H01Q 17/00* (2013.01); *H05K 9/0086* (2013.01); *H05K 9/0088* (2013.01); *B32B 2250/02* (2013.01); *B32B 2250/03* (2013.01); *B32B 2255/10* (2013.01); *B32B 2255/20* (2013.01); *B32B 2255/205* (2013.01); *B32B 2255/28* (2013.01); *B32B 2264/105* (2013.01); *B32B 2307/202* (2013.01); *B32B 2307/208* (2013.01); *B32B 2307/212* (2013.01); *B32B 2307/518* (2013.01); *B32B 2307/538* (2013.01); *B32B 2457/00* (2013.01)

(58) Field of Classification Search
CPC ............ B32B 2250/03; B32B 2255/10; B32B 2255/20; B32B 2255/205; B32B 2255/28; H01F 1/26; H01Q 17/00; H05K 9/0083; H05K 9/0086; H05K 9/0088; C01B 32/022–32/0293; C01B 2202/00
See application file for complete search history.

(56) References Cited

U.S. PATENT DOCUMENTS

| | | | |
|---|---|---|---|
| 7,301,109 B2 | 11/2007 | Chen | |
| 7,491,883 B2 | 2/2009 | Lee et al. | |
| 7,625,633 B2 | 12/2009 | Kawaguchi et al. | |
| 7,887,911 B2 | 2/2011 | Kawaguchi et al. | |
| 8,563,875 B2 | 10/2013 | Dai et al. | |
| 9,095,049 B2 | 7/2015 | Dai et al. | |
| 9,238,351 B2 | 1/2016 | Kagawa et al. | |
| 2005/0276978 A1 | 12/2005 | Chen | |
| 2006/0083948 A1 | 4/2006 | Kawaguchi et al. | |
| 2006/0233692 A1* | 10/2006 | Scaringe | B82Y 30/00 423/335 |
| 2008/0254675 A1 | 10/2008 | Lee et al. | |
| 2009/0159328 A1 | 6/2009 | Dai et al. | |
| 2009/0314411 A1 | 12/2009 | Kawaguchi et al. | |
| 2009/0314539 A1 | 12/2009 | Kawaguchi et al. | |
| 2010/0252184 A1* | 10/2010 | Morimoto | B82Y 30/00 156/241 |
| 2011/0008580 A1* | 1/2011 | Kagawa | B32B 15/08 428/167 |
| 2011/0031008 A1* | 2/2011 | Kagawa | B32B 3/30 174/377 |
| 2011/0140367 A1 | 6/2011 | Shi | |
| 2011/0177460 A1 | 7/2011 | Shi | |
| 2011/0186420 A1 | 8/2011 | Shi | |
| 2011/0268925 A1* | 11/2011 | Kagawa | H05K 9/0086 428/167 |
| 2014/0008013 A1 | 1/2014 | Dai et al. | |
| 2014/0154469 A1* | 6/2014 | Kagawa | H05K 9/0088 428/155 |
| 2015/0027771 A1* | 1/2015 | Kagawa | H05K 9/0088 174/350 |
| 2015/0382518 A1 | 12/2015 | Kagawa et al. | |

FOREIGN PATENT DOCUMENTS

| | | |
|---|---|---|
| CN | 101286383 A | 10/2008 |
| CN | 101466252 A1 | 6/2009 |
| CN | 102046370 A | 5/2011 |
| JP | 5-38765 A | 2/1993 |
| JP | 5-226873 A | 9/1993 |
| JP | 2002-59487 A | 2/2002 |
| JP | 2005-251918 A | 9/2005 |
| JP | 2005251918 A * | 9/2005 |
| JP | 2005251918 A * | 9/2005 |
| JP | 2008-135485 A | 6/2008 |
| JP | 2008135485 A * | 6/2008 |
| JP | 2009-202379 A | 9/2009 |
| JP | 2010-153542 A | 7/2010 |
| JP | 2010-283154 A | 12/2010 |
| JP | 2011-522964 A | 8/2011 |

OTHER PUBLICATIONS

JP 2008135485 A machine translation.*
JP 2005251918 A machine translation.*
Chinese Office Action and Search Report, dated Jul. 6, 2016, for Chinese Application No. 201280059175.9, together with a partial English translation thereof.
International Search Report issued in PCT/JP2012/080886, dated Mar. 5, 2013.
Office Action (including an English translation thereof) issued in the corresponding Korean Patent Application No. 10-2014-7017510 dated Apr. 18, 2017.

* cited by examiner

COMPOSITE ELECTROMAGNETIC-WAVE-ABSORBING SHEET

FIELD OF THE INVENTION

The present invention relates to a composite electromagnetic-wave-absorbing sheet having high electromagnetic wave absorbability in a wide frequency range even though it is thin.

BACKGROUND OF THE INVENTION

In communications apparatuses such as cell phones, smart phones, and wireless LANs, and electronic apparatuses such as computers, signals in as wide frequency ranges as from several MHz to several GHz are treated, generating electromagnetic wave noises in wide frequency ranges. Electromagnetic wave noises generated from communications apparatuses and electronic apparatuses should be reduced, circuits in the communications apparatuses and electronic apparatuses should be protected from external electromagnetic wave noises, and electromagnetic wave noises generated from individual circuit devices should be prevented from adversely affecting other circuit devices.

Electromagnetic shielding technologies are generally used for to electromagnetic wave noises. By the electromagnetic shielding technologies, noise sources and noise-receiving parts are surrounded by metal plates to shield electromagnetic wave noises. For example, with metal shield plates disposed in the casings of communications apparatuses and electronic apparatuses, electromagnetic wave noises generated therefrom are suppressed. However, because electromagnetic wave noises inside the apparatuses are not reduced, the metal shield plates do not sufficiently reduce noises for the mounted parts. Thus, what is desired are not electromagnetic wave shields reflecting electromagnetic wave noises, but electromagnetic wave-absorbing sheets capable of absorbing electromagnetic wave noises.

JP 2010-153542 A discloses a electromagnetic wave noise suppression sheet comprising a substrate, a conductive layer formed by coating a conductive paint, and a magnetic layer formed by coating a magnetic paint. Specific examples of the substrate include papers, non-woven or woven fabrics, cloths, resin sheets, etc. The conductive paint contains a metal such as copper, gold, aluminum, etc. or a conductive material such as carbon, etc. The magnetic paint contains particles of metal oxides such as soft-magnetic ferrite and a magnetic metal such as Sendust, Permalloy, and amorphous alloys. This electromagnetic wave noise suppression sheet has electromagnetic wave absorbability improved by both of the conductive layer and the magnetic layer. However, such combination of the conductive layer and the magnetic layer fails to provide sufficient electromagnetic wave absorbability.

OBJECT OF THE INVENTION

Accordingly, an object of the present invention is to provide a composite electromagnetic-wave-absorbing sheet having high electromagnetic wave absorbability in a wide frequency range, even though it is thin.

DISCLOSURE OF THE INVENTION

As a result of intensive research in view of the above object, the inventor has found that a combination of (a) a film having a thin metal film provided with large numbers of substantially parallel, intermittent, linear scratches with irregular widths and irregular intervals in plural directions, or a thin magnetic metal film heat-treated to have predetermined light transmittance and surface resistance, and (b) a film containing non-magnetic, conductive particles such as carbon, metal, etc. or magnetic particles such as magnetic metal, ferrite, etc. provides a composite electromagnetic-wave-absorbing sheet having high electromagnetic wave absorbability in a wide frequency range. The present invention has been completed based on such finding.

Thus, the first composite electromagnetic-wave-absorbing sheet of the present invention comprises (a) a first electromagnetic-wave-absorbing film comprising a plastic film, and a single- or multi-layer thin metal film formed on at least one surface of the plastic film, the thin metal film being provided with large numbers of substantially parallel, intermittent, linear scratches with irregular widths and irregular intervals in plural directions, and (b) a second electromagnetic-wave-absorbing film composed of a resin or a rubber in which magnetic particles or non-magnetic, conductive particles are dispersed.

The second composite electromagnetic-wave-absorbing sheet of the present invention comprises (a) a third electromagnetic-wave-absorbing film, and (b) a second electromagnetic-wave-absorbing film composed of a resin or a rubber in which magnetic particles or non-magnetic, conductive particles are dispersed, the third electromagnetic-wave-absorbing film comprising (i) a plastic film, (ii) a single- or multi-layer thin metal film formed on at least one surface of the plastic film, and provided with large numbers of substantially parallel, intermittent, linear scratches with irregular widths and irregular intervals in plural directions, and (iii) a thin carbon nanotube layer formed on the thin metal film.

The thin carbon nanotube layer preferably has a thickness (expressed by a coated amount) of 0.01-0.5 $g/m^2$. The carbon nanotube is preferably multi-layer carbon nanotube.

In the first and second composite electromagnetic-wave-absorbing sheets, the linear scratches are preferably oriented in two directions with a crossing angle of 30-90°. The linear scratches preferably have widths in a range of 0.1-100 μm for 90% or more and 1-50 μm on average, and transverse intervals in a range of 1-500 μm and 1-200 μm on average.

The thin metal film is preferably made of at least one metal selected from the group consisting of aluminum, copper, silver, tin, nickel, cobalt, chromium and alloys thereof.

The third composite electromagnetic-wave-absorbing sheet of the present invention comprises (a) a fourth electromagnetic-wave-absorbing film obtained by forming a thin magnetic metal film on at least one surface of a plastic film by a vapor deposition method, and then heat-treating it at a temperature in range of 110-180° C., the thin magnetic metal film having light transmittance of 3-50% to a laser ray having wavelength of 660 nm, and the thin magnetic metal film having surface resistance of 10-200 Ω/square when measured on a square test piece of 10 cm×10 cm cut out of the fourth electromagnetic-wave-absorbing film under a load of 3.85 kg applied via a flat pressure plate, with a pair of electrodes each having a length completely covering a side of the test piece disposed on opposing side portions of the thin magnetic metal film, and (b) a second electromagnetic-wave-absorbing film composed of a resin or a rubber in which magnetic particles or non-magnetic, conductive particles are dispersed.

The magnetic metal constituting the fourth electromagnetic-wave-absorbing film is preferably Ni or its alloy. The heat treatment is preferably conducted for 10 minutes to 1 hour.

In the first to third composite electromagnetic-wave-absorbing sheets, the amount of the magnetic particles or the non-magnetic, conductive particles in the second electromagnetic-wave-absorbing film is preferably 10-60% by volume. The magnetic particles or the non-magnetic, conductive particles preferably have an average particle size of 5-200 μm.

In the first to third composite electromagnetic-wave-absorbing sheets, the non-magnetic, conductive particles in the second electromagnetic-wave-absorbing film are preferably particles of a non-magnetic metal or carbon.

DESCRIPTION OF THE PREFERRED EMBODIMENTS

The embodiments of the present invention will be explained in detail below referring to the attached drawings. Explanations of each embodiment are applicable to other embodiments unless otherwise mentioned. Explanations below are not restrictive, but various modifications may be made within the scope of the present invention.

[1] First Composite Electromagnetic-Wave-Absorbing Sheet

Figure 1:
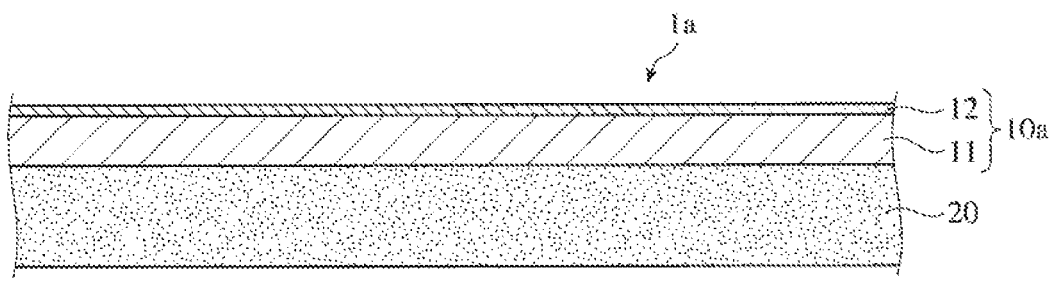
FIG. 1 is a partial cross-sectional view showing the first composite electromagnetic-wave-absorbing sheet of the present invention.

As shown in FIGS. 1 and 4, the first composite electromagnetic-wave-absorbing sheet 1a comprises (a) a first electromagnetic-wave-absorbing film 10a comprising a plastic film 11, and a single- or multi-layer thin metal film 12 formed on at least one surface of the plastic film, the thin metal film 12 being provided with large numbers of substantially parallel, intermittent, linear scratches 122 with irregular widths and irregular intervals in plural directions, and (b) a second electromagnetic-wave-absorbing film 20 composed of a resin or a rubber in which magnetic particles or non-magnetic, conductive particles are dispersed.

(1) First Electromagnetic-Wave-Absorbing Film

As shown in FIG. 4(*a*), the first electromagnetic-wave-absorbing film 10a has a structure in which a single- or multi-layer thin metal film 12 is formed on at least one surface of a plastic film 11. FIGS. 4(*a*) to 4(*d*) show an example in which a thin metal film 12 formed on the entire surface of the plastic film 11 is provided with large numbers of substantially parallel, intermittent, linear scratches 122 (122a, 122b) in two directions.

(a) Plastic Film

Resins forming the plastic film 11 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. From the aspect of strength and cost, polyethylene terephthalate is preferable. The thickness of the plastic film 11 may be about 10-100 µm, preferably 10-30 µm.

(b) Thin Metal Film

Metals forming the thin metal film 12 are not particularly restrictive as long as they have conductivity, and they are preferably aluminum, copper, silver, tin, nickel, cobalt, chromium and their alloys, particularly aluminum, copper, nickel and their alloys, from the aspect of corrosion resistance and cost. The thickness of the thin metal film is preferably 0.01 µm or more. Though not restrictive, the upper limit of the thickness may be practically about 10 µm. Of course, the thin metal film may be thicker than 10 µm, with substantially no change in the absorbability of high-frequency electromagnetic waves. The thickness of the thin metal film is more preferably 0.01-5 µm, most preferably 0.01-1 µm. The thin metal film 12 can be formed by vapor deposition methods (physical vapor deposition methods such as a vacuum vapor deposition method, a sputtering method and an ion plating method, or chemical vapor deposition methods such as a plasma CVD) method, a thermal CVD method and a photo CVD method), plating methods, or foil-bonding methods.

When the thin metal film 12 is a single layer, the thin metal film 12 is preferably made of aluminum or nickel from the aspect of conductivity, corrosion resistance and cost. When the thin metal film 12 has a multi-layer structure, one layer may be formed by a non-magnetic metal, while the other layer may be formed by a magnetic metal. The non-magnetic metals include aluminum, copper, silver, tin and these alloys, and the magnetic metals include nickel, cobalt, chromium and these alloys. The thickness of the thin magnetic metal film is preferably 0.01 µm or more, and the thickness of the thin non-magnetic metal film is preferably 0.1 µm or more. Though not restrictive, the upper limits of their thickness may be practically about 10 µm. More preferably, the thickness of the thin magnetic metal film is 0.01-5 µm, and the thickness of the thin non-magnetic metal film is 0.1-5 µm. FIGS. 4(e) and 4(f) show the first electromagnetic-wave-absorbing film 10a' having two-layer, thin metal films 121a, 121b formed on a plastic film 11.

(c) Linear Scratches

Figure 4A:
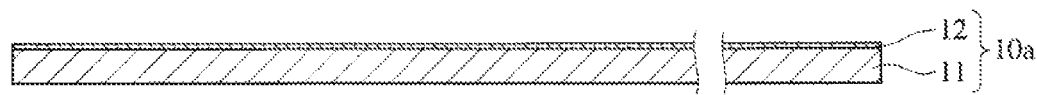
FIG. 4(a) is a cross-sectional view showing one example of first electromagnetic-wave-absorbing films used in the first composite electromagnetic-wave-absorbing sheet of the present invention.
Figure 4B:
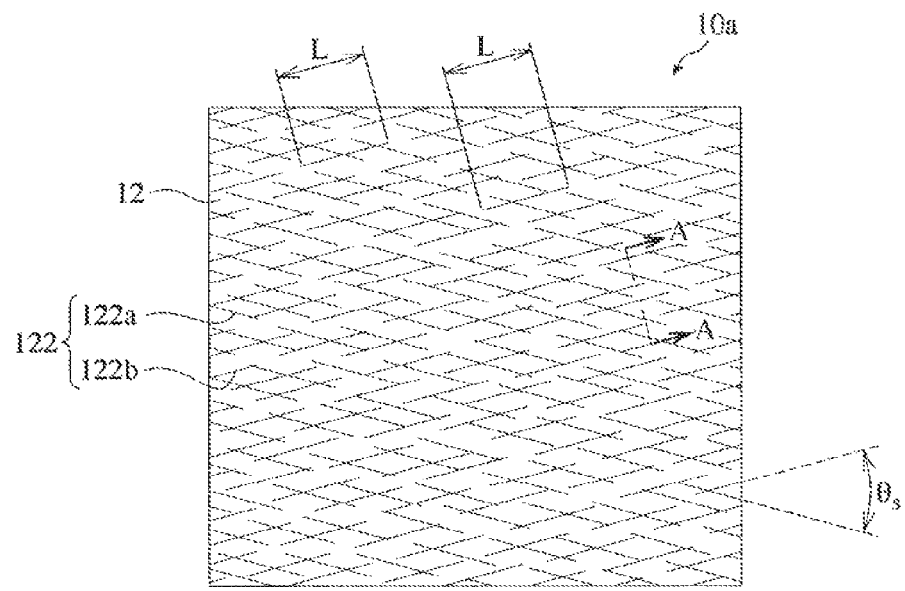
FIG. 4(b) is a partial plan view showing the details of linear scratches on the first electromagnetic-wave-absorbing film of FIG. 4(a).
Figure 4C:
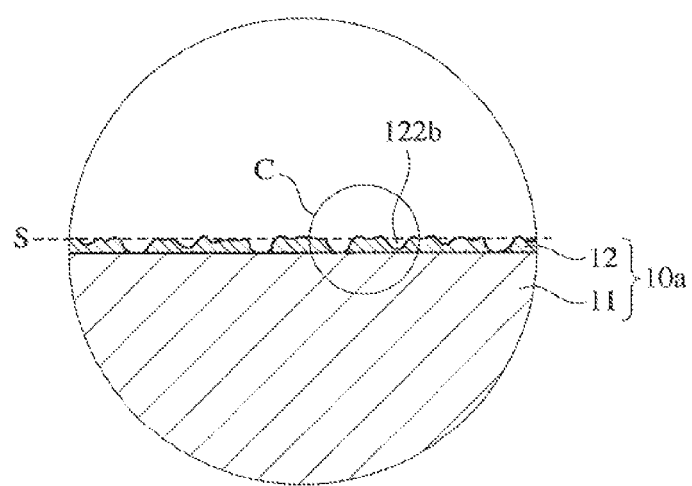
FIG. 4(c) is a cross-sectional view taken along the line A-A in FIG. 4(b).
Figure 4D:
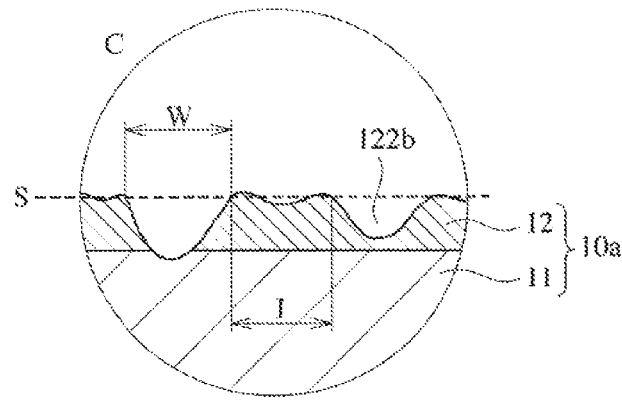
FIG. 4(d) is an enlarged cross-sectional view showing a portion C in FIG. 4(c).
Figure 4E:
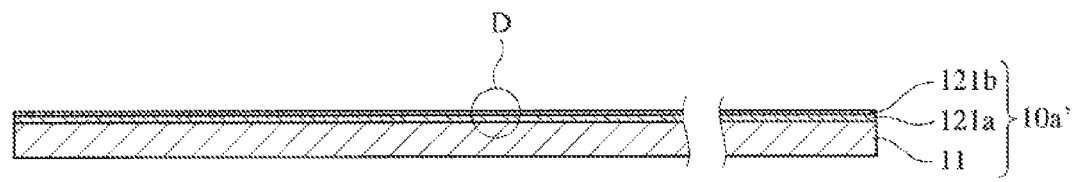
FIG. 4(e) is a cross-sectional view showing another example of first electromagnetic-wave-absorbing films.
Figure 4F:
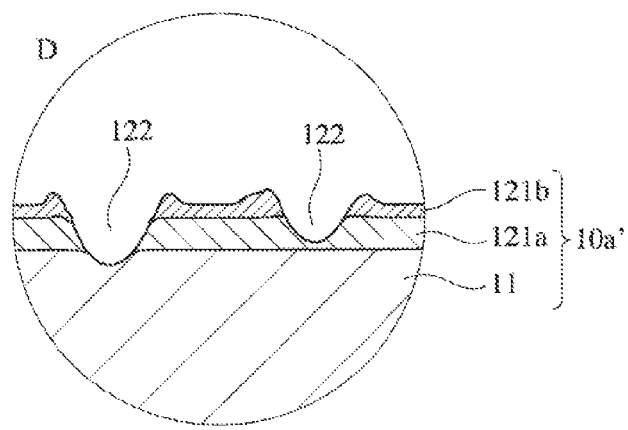
FIG. 4(f) is an enlarged cross-sectional view showing a portion D in FIG. 4(e).

As shown in FIGS. 4(b) to 4(d), the thin metal film 12 is provided with large numbers of substantially parallel, intermittent, linear scratches 122a, 122b with irregular widths and irregular intervals in two directions. The depth of the linear scratches 122 is exaggerated in FIGS. 4(c) and 4(d) for the purpose of explanation. The linear scratches 122 oriented in two directions have various widths W and intervals I. Because the linear scratches 122 are formed by sliding contact with a pattern roll having fine hard particles (fine diamond particles) randomly attached to the surface as described later, the linear scratches have transverse intervals I determined by the intervals of fine hard particles on the pattern roll, and longitudinal intervals I determined by the intervals of fine hard particles and the relative peripheral speed of the pattern roll to the composite film. Though explanation will be made on transverse intervals I below, such explanation is applicable to longitudinal intervals as it is. The widths W of the linear scratches 122 are measured at a height corresponding to the surface S of the thin metal film 12 before forming linear scratches, and the intervals I of the linear scratches 122 are measured at a height corresponding to the surface S of the thin metal film 12 before forming linear scratches. Because the linear scratches 122 have various widths W and intervals I, the composite electromagnetic-wave-absorbing sheet can efficiently absorb electromagnetic waves in a wide frequency range.

90% or more of the widths W of the linear scratches 122 are preferably in a range of 0.1-100 µm, more preferably in a range of 0.5-50 µm, most preferably in a range of 0.5-20 µm. The average width Wav of the linear scratches 122 is preferably 1-50 µm, more preferably 1-10 µm, most preferably 1-5 µm.

The transverse intervals I of the linear scratches 122 are preferably in a range of 1-200 µm, more preferably in a range of 1-100 µm, most preferably in a range of 1-50 µm, particularly in a range of 1-30 µm. The average transverse interval Iav of the linear scratches 122 is preferably 1-100 µm, more preferably 5-50 µm, most preferably 5-30 µm.

Because the lengths L of the linear scratches 122 are determined by sliding conditions (mainly relative peripheral speeds of a roll and a film, and the angle of the composite film around the roll), they are mostly substantially the same (substantially equal to the average length) unless the sliding conditions are changed. The lengths of the linear scratches 122 may be practically about 1-100 mm, preferably 2-10 mm, though not particularly restrictive.

Figure 5A:
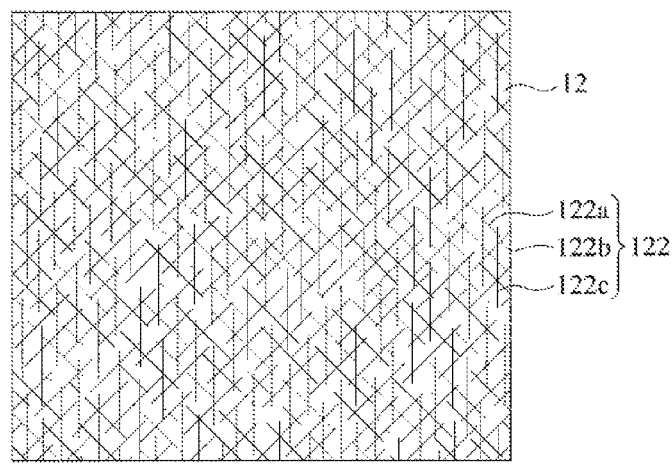
FIG. 5(a) is a partial plan view showing another example of linear scratches formed on a thin metal film in the first electromagnetic-wave-absorbing film.
Figure 5B:
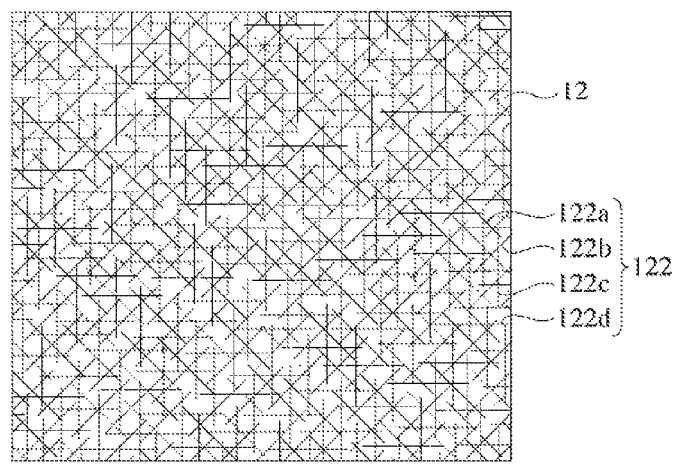
FIG. 5(b) is a partial plan view showing a further example of linear scratches formed on a thin metal film in the first electromagnetic-wave-absorbing film.
Figure 5C:
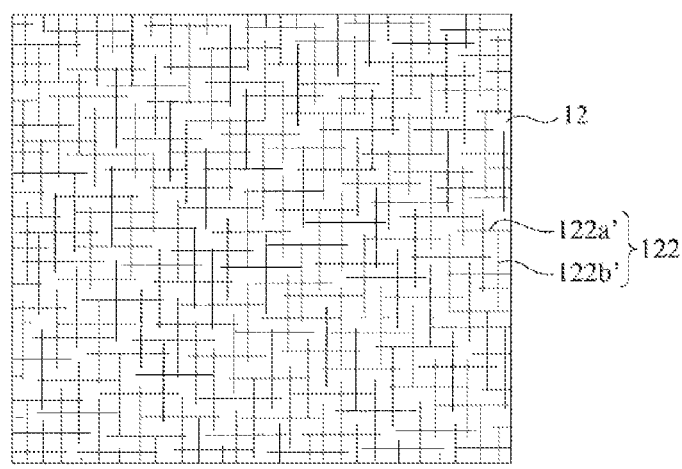
FIG. 5(c) is a partial plan view showing a still further example of linear scratches formed on a thin metal film in the first electromagnetic-wave-absorbing film.

The acute crossing angle (hereinafter referred to simply as "crossing angle" unless otherwise mentioned) θs of the linear scratches 122a, 122b are preferably 10-90°, more preferably 30-90°. With sliding conditions (sliding direction, peripheral speed ratio, etc.) between the composite film and the pattern roll adjusted, linear scratches 122 with various crossing angles θs can be formed as shown in FIGS. 5(a) to 5(c). FIG. 5(a) shows an example of linear scratches 122a, 122b, 122c in three directions, FIG. 5(b) shows an example of linear scratches 122a, 122b, 122c, 122d in four directions, and FIG. 5(c) shows an example of perpendicularly crossing linear scratches 122a', 122b'.

(d) Fine Pores

Figure 6A:
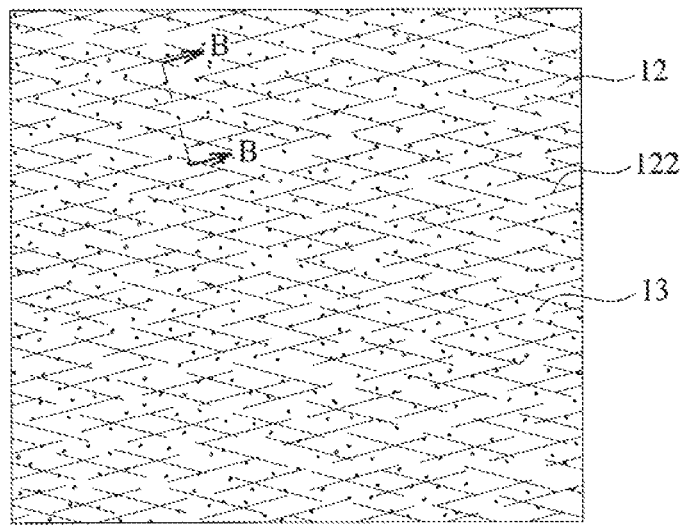
FIG. 6(a) is a partial plan view showing a first electromagnetic-wave-absorbing film having a thin metal film provided with fine pores in addition to linear scratches.
Figure 6B:
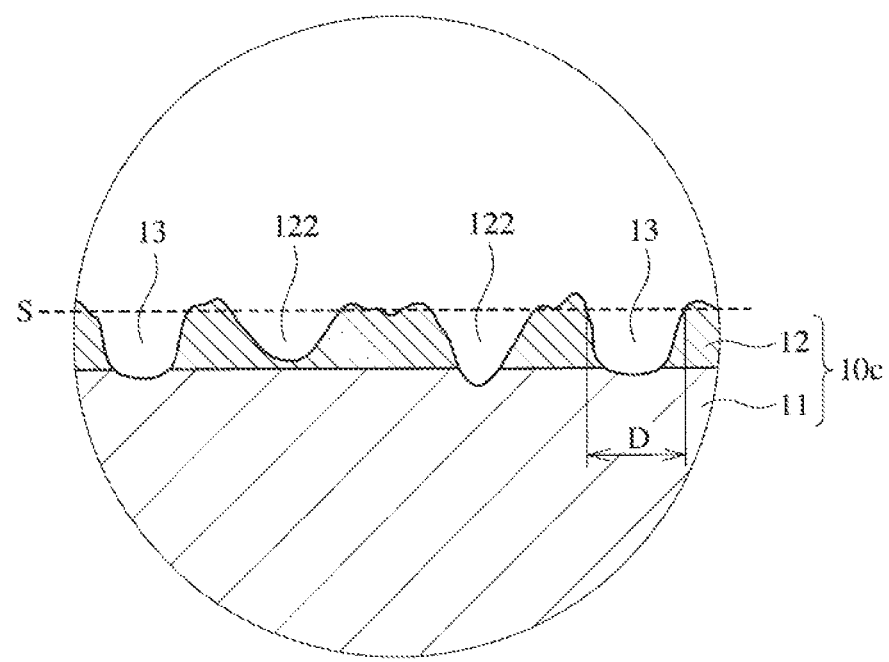
FIG. 6(b) is a cross-sectional view taken along the line B-B in FIG. 6(a).

As shown in FIGS. 6(a) and 6(b), the thin metal film 12 may be provided with large numbers of fine penetrating pores 13 at random in addition to the linear scratches 122. The fine pores 13 can be formed by pressing a roll having fine, high-hardness particles on the surface to the thin metal film 12. As shown in FIG. 6(b), the opening diameters D of the fine pores 13 are determined at a height corresponding to the surface S of the thin metal film 12 before forming the linear scratches. 90% or more of the opening diameters D of the fine pores 13 are preferably in a range of 0.1-1000 µm, more preferably in a range of 0.1-500 µm. The average opening diameter Dav of the fine pores 13 is preferably in a range of 0.5-100 µm, more preferably in a range of 1-50 µm.

(2) Formation of Linear Scratches in First Electromagnetic-Wave-Absorbing Film

FIGS. 8(a) to 8(e) show one example of apparatuses for forming linear scratches in two directions on the thin metal film on the plastic film. This apparatus comprises (a) a reel 21 from which a thin metal film-plastic composite film 100 is wound off, (b) a first pattern roll 2a arranged in a different direction from the transverse direction of the composite film 100 on the side of the thin metal film 12, (c) a first push roll 3a arranged upstream of the first pattern roll 2a on the opposite side to the thin metal film 12, (d) a second pattern roll 2b arranged in an opposite direction to the first pattern roll 2a with respect to the transverse direction of the composite film 100 on the side of the thin metal film 12, (e) a second push roll 3b arranged downstream of the second pattern roll 2b on the opposite side to the thin metal film 12, (f) an electric-resistance-measuring means 4a arranged on the side of the thin metal film 12 between the first and second pattern rolls 2a, 2b, (g) an electric-resistance-measuring means 4b arranged downstream of the second pattern roll 2b on the side of the thin metal film 12, and (h) a reel 24, around which the linearly scratched, thin metal film-plastic composite film 1 is wound. In addition, pluralities of guide rolls 22, 23 are arranged at predetermined positions. Each pattern roll 2a, 2b is supported by a backup roll (for instance, rubber roll) 5a, 5b to prevent bending.

Figure 8A:
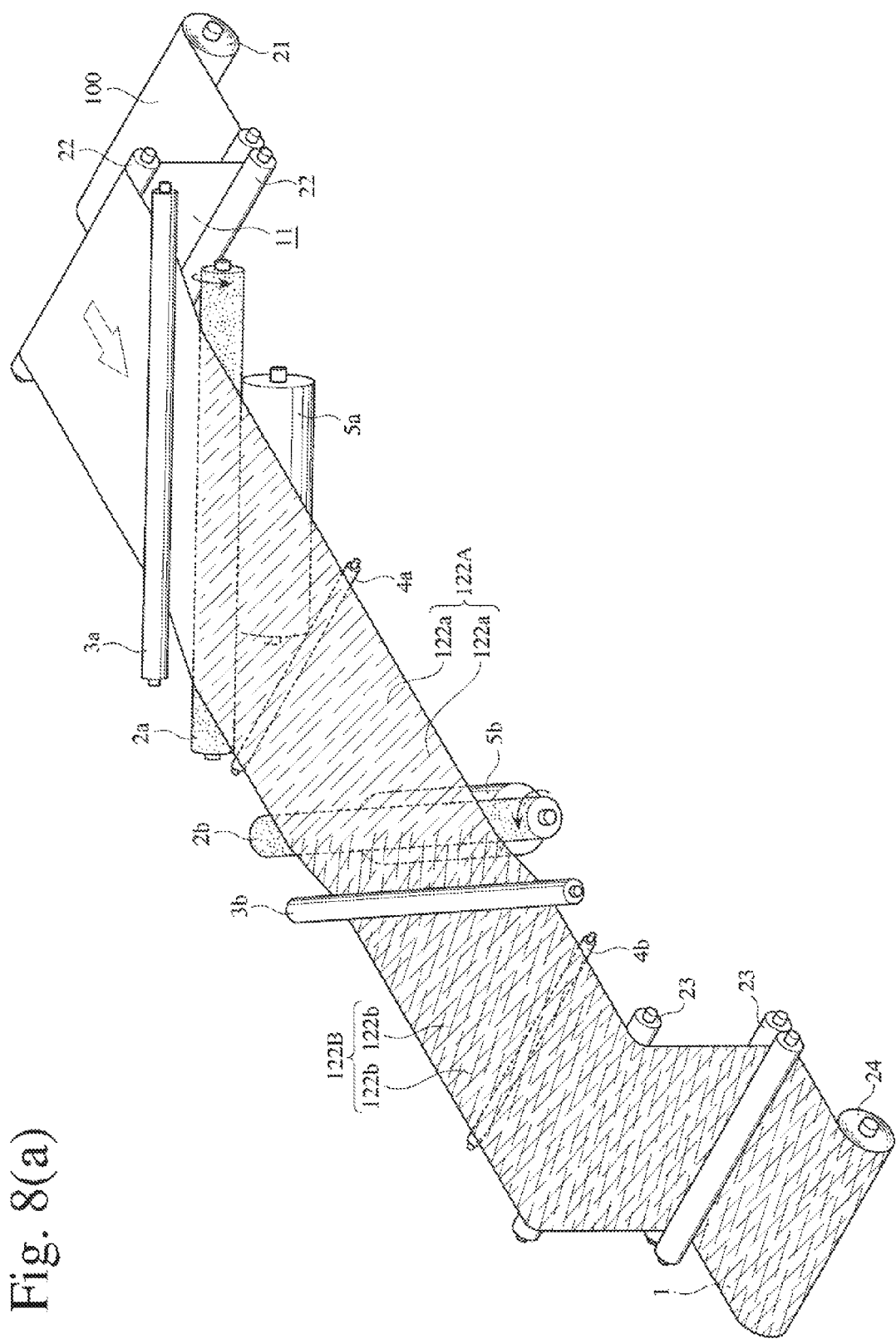
FIG. 8(a) is a perspective view showing one example of apparatuses for forming linear scratches.
Figure 8B:
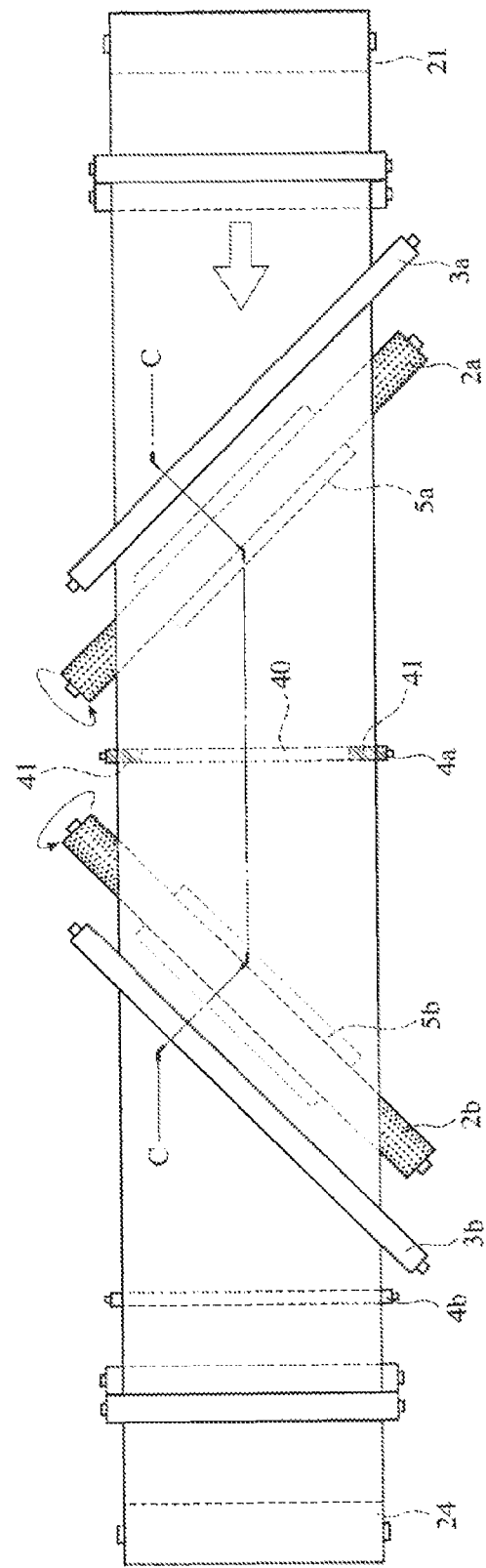
FIG. 8(b) is a plan view showing the apparatus of FIG. 8(a).
Figure 8C:
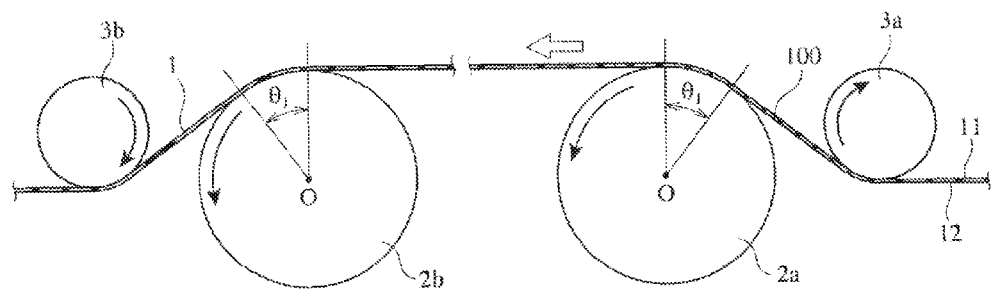
FIG. 8(c) is a cross-sectional view taken along the line C-C in FIG. 8(b).

As shown in FIG. 8(c), because each push roll 3a, 3b comes into contact with the composite film 100 at a lower position than the position at which it is brought into sliding contact with each pattern roll 2a, 2b, the thin metal film 12 of the composite film 100 is pushed by each pattern roll 2a, 2b. By adjusting the longitudinal position of each push roll 3a, 3b with this condition met, the pressing power of each pattern roll 2a, 2b to the thin metal film 12 can be controlled, and the sliding distance in proportional to the center angle $\theta_1$ can also be controlled.

Figure 8D:
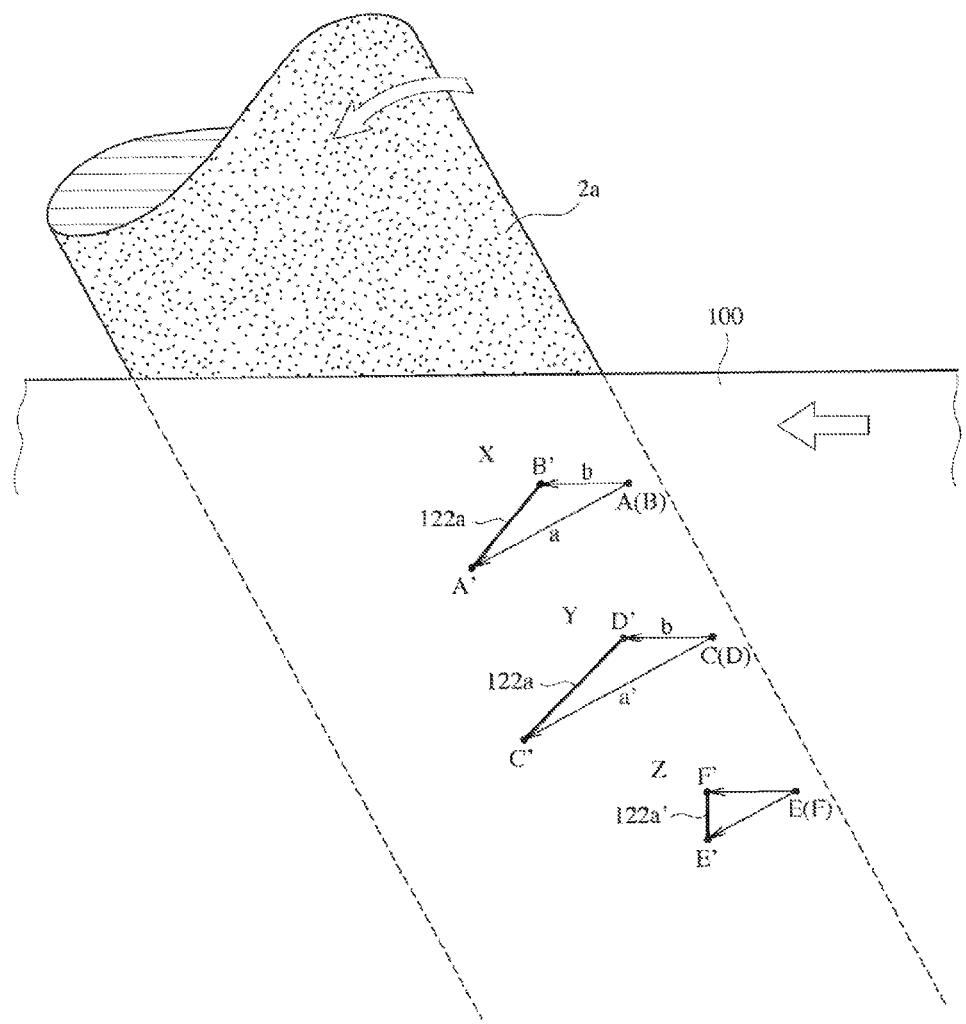
FIG. 8(d) is a partial, enlarged plan view for explaining the principle of forming linear scratches inclined relative to the moving direction of a composite film.
Figure 8E:
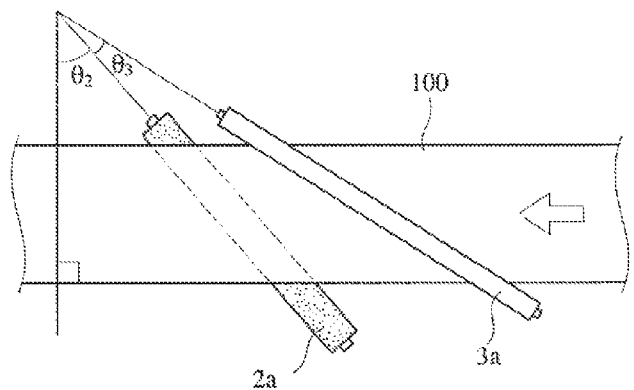
FIG. 8(e) is a partial plan view showing the inclination angles of a pattern roll and a push roll from a composite film in the apparatus of FIG. 8(a).

FIG. 8(d) shows the principle that linear scratches 122a are formed on the composite film 100 with inclination from the moving direction thereof. Because the pattern roll 2a is inclined relative to the moving direction of the composite film 100, the moving direction (rotation direction) a of fine hard particles on the pattern roll 2a differs from the moving direction b of the composite film 100. After a fine hard particle at a point A on the pattern roll 2a comes into contact with the thin metal film 12 to form a scratch B at an arbitrary time as shown by X, the fine hard particle moves to a point A', and the scratch B moves to a point B', in a predetermined period of time. While the fine hard particle moves from the point A to the point A', the scratch is continuously formed, resulting in a linear scratch 122a extending from the point B' to the point A'.

The directions and crossing angle $\theta$s of the first and second linear scratch groups 122A, 122B formed by the first and second pattern rolls 2a, 2b can be adjusted by changing the angle of each pattern roll 2a, 2b to the composite film 100, and/or the peripheral speed of each pattern roll 2a, 2b relative to the moving speed of the composite film 100. For instance, when the peripheral speed a of the pattern roll 2a relative to the moving speed b of the composite film 100 increases, the linear scratches 122a can be inclined 45° from the moving direction of the composite film 100 like a line C'D' as shown by Y in FIG. 8(d). Similarly, the peripheral speed a of the pattern roll 2a can be changed by changing the inclination angle $\theta_2$ of the pattern roll 2a to the transverse direction of the composite film 100. This is true of the pattern roll 2b. Accordingly, with both pattern rolls 2a, 2b adjusted, the directions of the linear scratches 122a, 122b can be changed as illustrated in FIGS. 4(b) and 5(c).

Because each pattern roll 2a, 2b is inclined relative to the composite film 100, sliding with each pattern roll 2a, 2b provides the composite film 100 with a force in a transverse direction. Accordingly, to prevent the lateral movement of the composite film 100, the longitudinal position and/or angle of each push roll 3a, 3b to each pattern roll 2a, 2b are preferably adjusted. For instance, the proper adjustment of a crossing angle $\theta_3$ between the axis of the pattern roll 2a and the axis of the push roll 3a provides pressing power with such a transverse distribution as to cancel transverse force components, thereby preventing the lateral movement. The adjustment of a distance between the pattern roll 2a and the push roll 3a also contributes to the prevention of the lateral movement. To prevent the lateral movement and breakage of the composite film 100, the rotation directions of the first and second pattern rolls 2a, 2b inclined relative to the transverse direction of the composite film 100 are preferably the same as the moving direction of the composite film 100.

As shown in FIG. 8(b), each roll-shaped electric-resistance-measuring means 4a, 4b comprises a pair of electrodes 41, 41 via an insulating portion 40, to measure the electric resistance of the thin metal film 12 with linear scratches therebetween. Feedbacking the electric resistance measured by the electric-resistance-measuring means 4a, 4b, operation conditions such as the moving speed of the composite film 100, the rotation speeds and inclination angles $\theta_2$ of the pattern rolls 2a, 2b, the positions and inclination angles $\theta_3$ of the push rolls 3a, 3b, etc. are adjusted.

Figure 9:
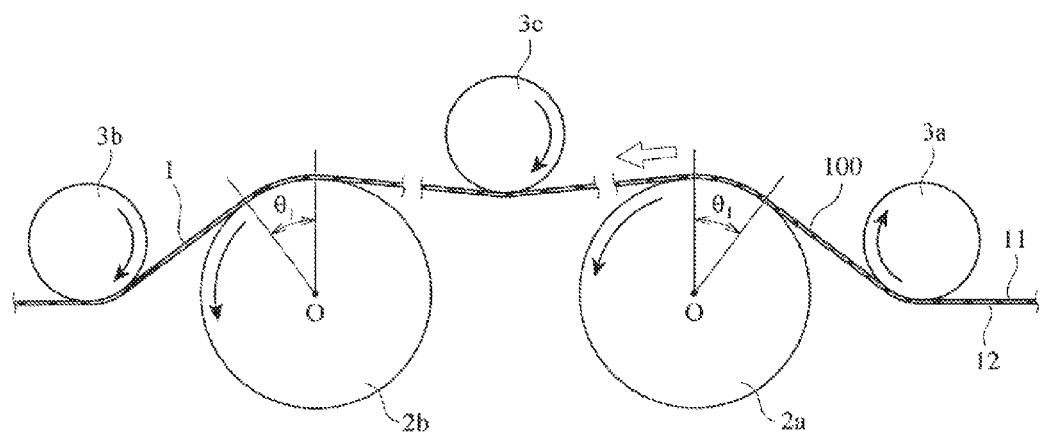
FIG. 9 is a partial cross-sectional view showing another example of apparatuses for forming linear scratches.

To increase the power of the pattern rolls 2a, 2b pressing the composite film 100, a third push roll 3c may be provided between the pattern rolls 2a, 2b as shown in FIG. 9. The third push roll 3c increases the sliding distance of the thin metal film 12 proportional to the center angle $\theta_1$, resulting in longer linear scratches 122a, 122b. The adjustment of the position and inclination angle of the third push roll 3c contributes to the prevention of the lateral movement of the composite film 100.

Figure 10:
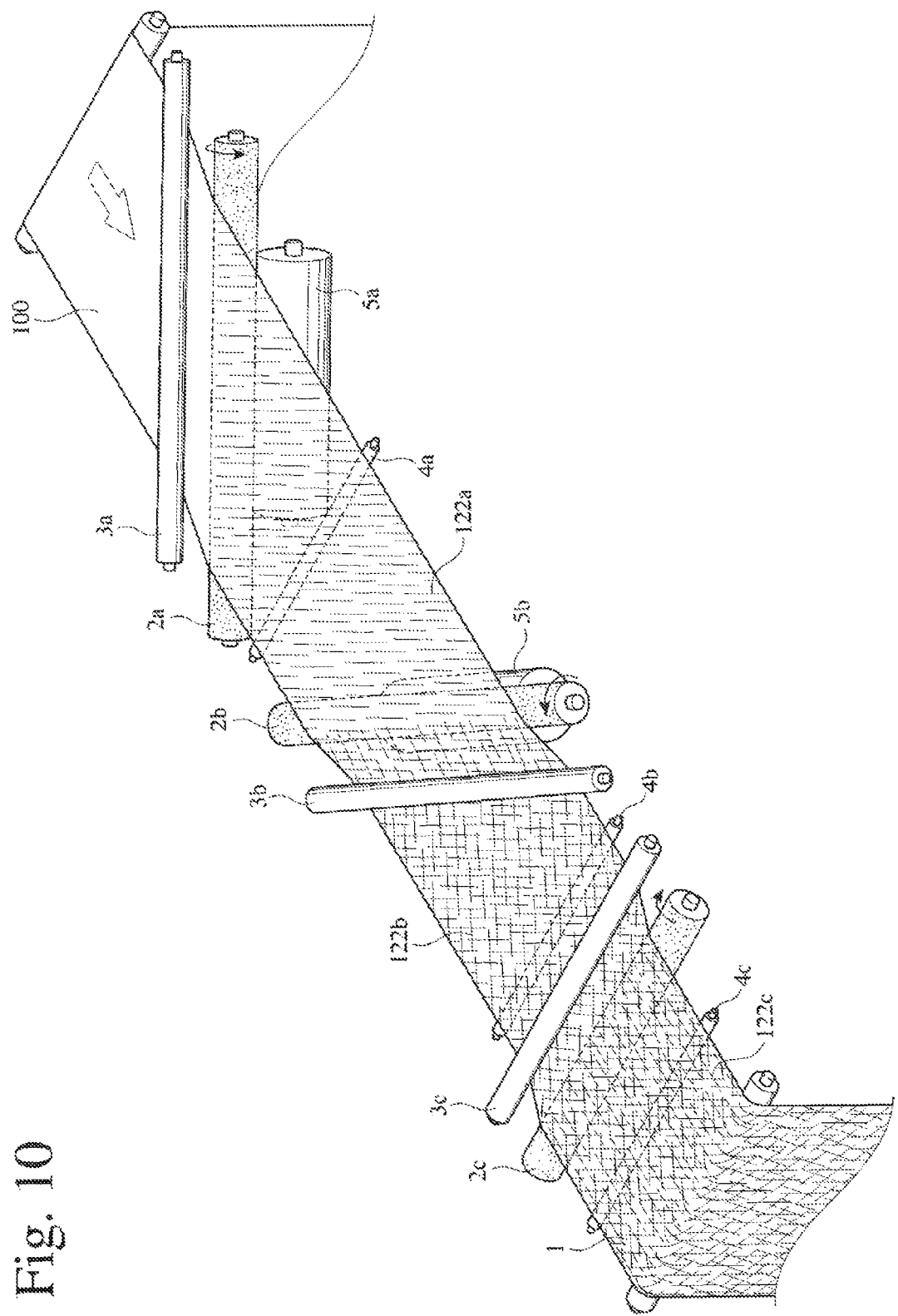
FIG. 10 is a perspective view showing a further example of apparatuses for forming linear scratches.

FIG. 10 shows one example of apparatuses for forming linear scratches 122a, 122b, 122c oriented in three directions as shown in FIG. 5(a). This apparatus is different from the apparatus shown in FIGS. 8(a) to 8(e) in that it comprises a third pattern roll 2c and a third push roll 3c both parallel to the transverse direction of the composite film 100 downstream of the second pattern roll 2b. Though the rotation direction of the third pattern roll 2c may be the same as or opposite to the moving direction of the composite film 100, it is preferably an opposite direction to form linear scratches efficiently. The third pattern roll 2c parallel to the transverse direction forms linear scratches 122c aligned with the moving direction of the composite film 100. Though the third push roll 3c is arranged upstream of the third pattern roll 2c, it may be on the downstream side. An electric-resistance-measuring roll 4c may be arranged downstream of the third pattern roll 2c. Not restricted to the depicted examples, the third pattern roll 2c may be arranged upstream of the first pattern roll 2a, or between the first and second pattern rolls 2a, 2b.

Figure 11:
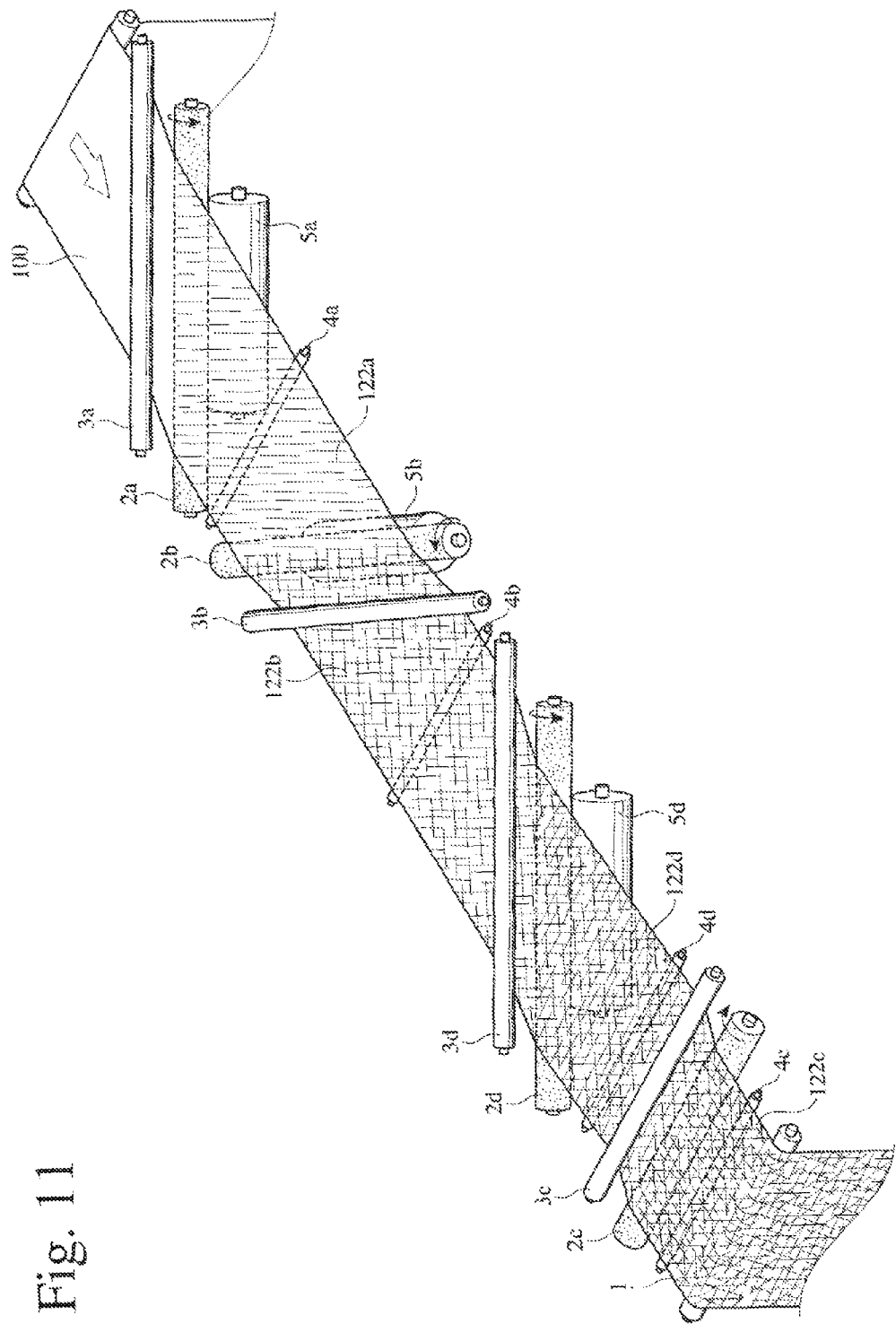
FIG. 11 is a perspective view showing a still further example of apparatuses for forming linear scratches.

FIG. 11 shows one example of apparatuses for forming linear scratches 122a, 122b, 122c, 122d oriented in four directions as shown in FIG. 5(b). This apparatus is different from the apparatus shown in FIG. 10, in that it comprises a fourth pattern roll 2d between the second pattern roll 2b and the third pattern roll 2c, and a fourth push roll 3d upstream of the fourth pattern roll 2d. With a slower rotation speed of the fourth pattern roll 2d, the direction (line E'F') of linear scratches 122a' can be made in parallel to the transverse direction of the composite film 100 as shown by Z in FIG. 8(d).

Figure 12:
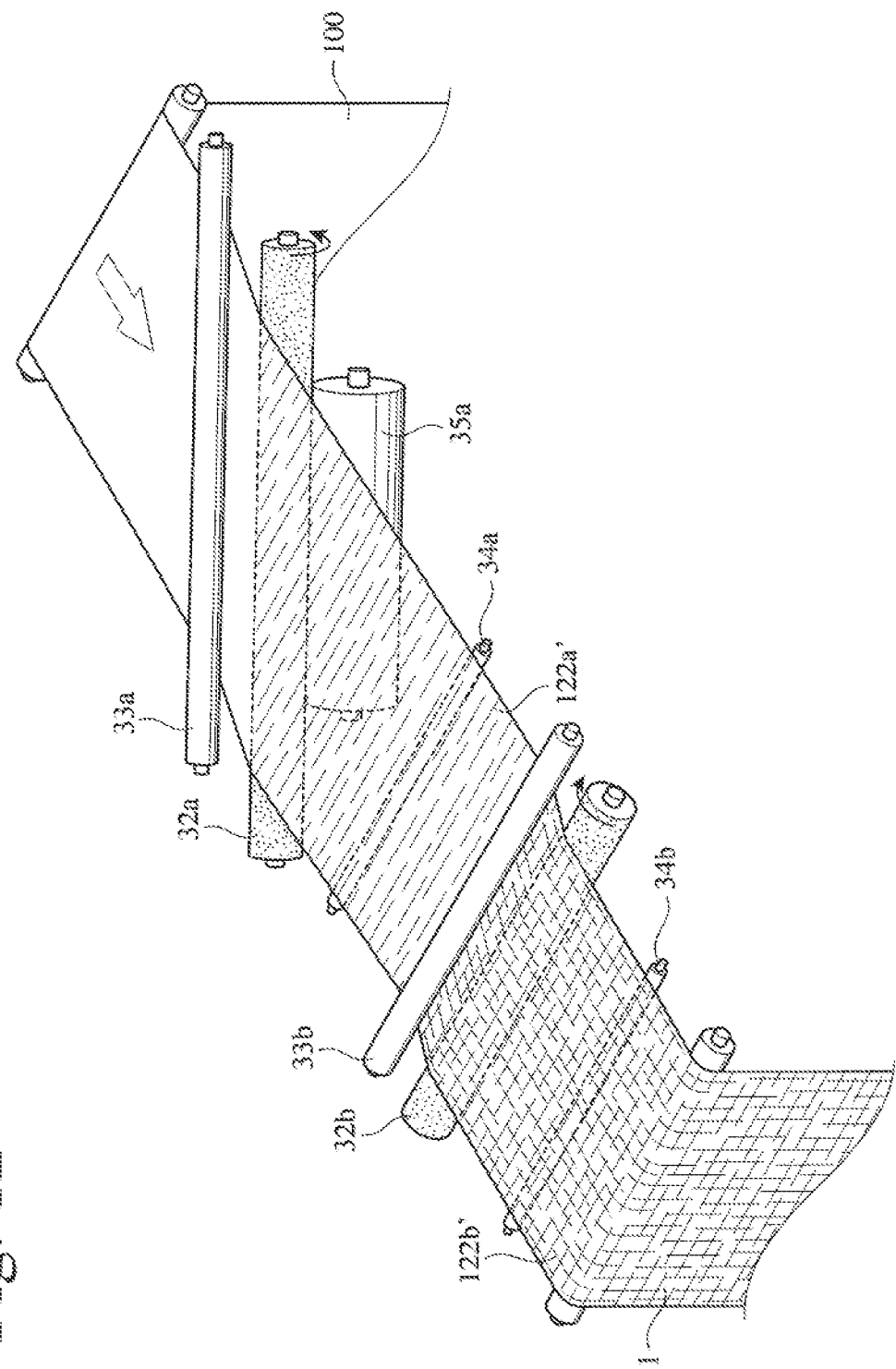
FIG. 12 is a perspective view showing a still further example of apparatuses for forming linear scratches.

FIG. 12 shows another example of apparatuses for forming linear scratches 122a', 122b' oriented in two perpendicular directions as shown in FIG. 5(c). This apparatus is different from the apparatus shown in FIGS. 8(a) to 8(e), in that the second pattern roll 32b is in parallel to the transverse direction of the composite film 100. Accordingly, only portions different from those shown in FIGS. 8(a) to 8(e) will be explained below. The rotation direction of the second pattern roll 32b may be the same as or opposite to the moving direction of the composite film 100. Also, the second push roll 33b may be upstream or downstream of the second pattern roll 32b. This apparatus makes the direction (line E'F') of linear scratches 122a' in alignment with the transverse direction of the composite film 100 as shown by Z in FIG. 8(*d*), suitable for forming linear scratches shown in FIG. 5(*c*).

Operation conditions determining not only the inclination angles and crossing angles of linear scratches but also their depths, widths, lengths and intervals are the moving speed of the composite film 100, the rotation speeds and inclination angles and pressing powers of the pattern rolls, etc. The moving speed of the composite film is preferably 5-200 m/minute, and the peripheral speed of the pattern roll is preferably 10-2,000 m/minute. The inclination angles $\theta_2$ of the pattern rolls are preferably 20-60°, particularly about 45°. The tension (proportional to the pressing power) of the composite film 100 is preferably 0.05-5 kgf/cm width.

The pattern roll used in the apparatus for forming linear scratches is preferably a roll having fine particles with sharp edges and Mohs hardness of 5 or more on the surface, for instance, the diamond roll described in JP 2002-59487 A. Because the widths of linear scratches are determined by the sizes of fine particles, 90% or more of fine diamond particles have sizes preferably in a range of 1-1,000 μm, more preferably in a range of 5-200 μm. The fine diamond particles are attached to the roll surface preferably in an area ratio of 50% or more.

The thin metal film 12 having linear scratches 122 may be provided with large numbers of fine pores 13 by the method described in Japanese Patent 2063411. A roll per se for forming fine pores 13 may be the same as the roll for forming linear scratches. Fine pores 13 can be formed by causing the composite film 100 to pass between a roll having large numbers of fine particles with sharp edges and Mohs hardness of 5 or more on the surface like the roll for forming linear scratches and a roll having a smooth surface at the same peripheral speed.

(3) Second Electromagnetic-Wave-Absorbing Film

As shown in FIG. 1, the second electromagnetic-wave-absorbing film 20 constituting the first composite electromagnetic-wave-absorbing sheet 1*a* is composed of a resin or a rubber in which magnetic particles or non-magnetic, conductive particles are dispersed.

(a) Magnetic Particles or Non-Magnetic, Conductive Particles

The magnetic particles include magnetic metal particles and magnetic non-metallic particles. The magnetic metal particles may be particles of pure iron, Fe—Si alloys, Fe—Al alloys, Fe—Si—Al alloys such as Sendust, Permalloy, amorphous alloys, etc. The magnetic, non-metallic particles may be particles of ferrite such as Ni—Zn ferrite, Cu—Zn ferrite, Mn—Zn ferrite, etc.

The non-magnetic, conductive particles include non-magnetic metal particles and non-magnetic, conductive, non-metallic particles. The non-magnetic metals include copper, silver, gold, aluminum, etc. The non-magnetic, conductive, non-metallic particles include graphite particles and carbon black.

To prevent the corrosion of magnetic particles and non-magnetic, conductive particles, to improve their dispersibility in a resin or a rubber, and to secure the electric resistance of the second electromagnetic-wave-absorbing film, the magnetic particles and non-magnetic, conductive particles are preferably coated with silane coupling agents, etc.

The magnetic particles and non-magnetic, conductive particles preferably have an average particle size of 5-200 μm. The average particle size of less than 5 μm makes their dispersion in a resin or a rubber difficult, and the average particle size of more than 200 μm makes their uniform dispersion in a resin or a rubber difficult, so that the resin or rubber in which magnetic particles or non-magnetic, conductive particles are dispersed cannot easily be formed into a film. The average particle size of magnetic particles and non-magnetic, conductive particles is more preferably 10-100 μm.

(b) Resin or Rubber

The resins forming the second electromagnetic-wave-absorbing film 20 are not particularly restrictive as long as they have sufficient strength, flexibility and workability in addition to the dispersibility of magnetic particles and non-magnetic, conductive particles and insulation, and they may be, for example, polyesters (polyethylene terephthalate, etc.), polyarylene sulfide (polyphenylene sulfide, etc.), polyamides, polycarbonates, acrylic resins, polystyrenes, polyvinyl chloride, polyolefins (polyethylene, polypropylene, etc.), etc.

The rubbers include, for example, chloroprene rubbers, ethylene-propylene-diene rubbers, acrylonitrile rubbers, ethylene-vinyl acetate copolymers, polyurethanes, styrene-butadiene rubbers, etc.

(c) Composition

The amount of magnetic particles or non-magnetic, conductive particles in the second electromagnetic-wave-absorbing film 20 is preferably 10-60% by volume. Less than 10% by volume of magnetic particles or non-magnetic, conductive particles fail to provide the second electromagnetic-wave-absorbing film 20 with sufficient electromagnetic wave absorbability, and more than 60% by volume of magnetic particles or non-magnetic, conductive particles are not easily dispersed in the resin or rubber. The amount of magnetic particles or non-magnetic, conductive particles is more preferably 30-50% by volume.

(d) Thickness

The thicker second electromagnetic-wave-absorbing film 20 generally provides higher electromagnetic wave absorbability, but too thick a second electromagnetic-wave-absorbing film 20 cannot be disposed in a circuit in a small electronic or communications apparatus. Accordingly, the thickness of the second electromagnetic-wave-absorbing film 20 is preferably 1 mm or less, more preferably 0.5 mm or less. The lower limit of the thickness of the second electromagnetic-wave-absorbing film 20 is practically about 0.1 mm.

[2] Second Composite Electromagnetic-Wave-Absorbing Sheet

Figure 2:
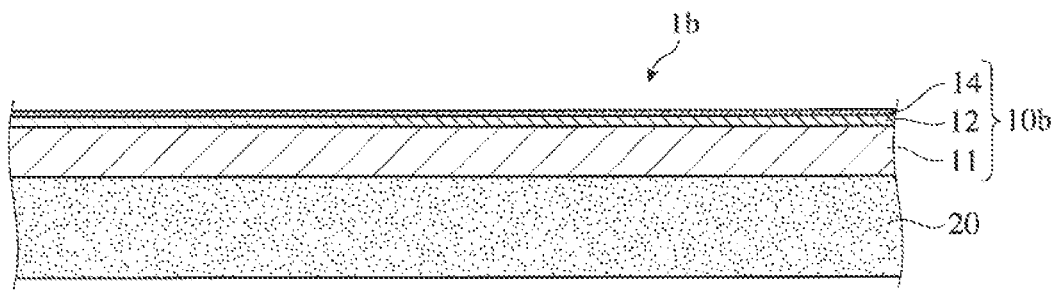
FIG. 2 is a partial cross-sectional view showing the second composite electromagnetic-wave-absorbing sheet of the present invention.

As shown in FIG. 2, the second composite electromagnetic-wave-absorbing sheet 1*b* is the same as the first composite electromagnetic-wave-absorbing sheet 1*a*, except that a thin carbon nanotube layer 14 is formed on the thin metal film 12. FIG. 7(*a*) shows an example in which a thin carbon nanotube layer 14 is formed on a single-layer thin metal film 12, and FIG. 7(*b*) shows an example in which a thin carbon nanotube layer 14 is formed on a two-layer thin metal film 12 comprising thin metal films 121*a*, 121*b*. In the depicted examples, a protective plastic layer 15 is provided on the thin carbon nanotube layer 14.

(1) Thin Nanotube Layer

Carbon nanotube per se may have a single-layer structure or a multi-layer structure. The multi-layer carbon nanotube having an outer diameter of 10 to several tens of nanometers is preferable, because it can be easily formed into a thin uniform layer without aggregation, and has excellent conductivity. The thin carbon nanotube layer 14 preferably has a thickness (expressed by a coated amount) of 0.01-0.5 g/m$^2$. When the thin carbon nanotube layer 14 is thinner than 0.01 g/m$^2$, it cannot provide sufficient effects of improving electromagnetic wave absorbability and uniformity. On the other hand, when it is thicker than 0.5 g/m², it is difficult to prevent the aggregation of carbon nanotube, resulting in a non-uniform thin carbon nanotube layer 14. The thickness of the thin carbon nanotube layer 14 is more preferably 0.02-0.2 g/m², most preferably 0.04-0.1 g/m².

Though it is not clear why the thin carbon nanotube layer 14 improves electromagnetic wave absorbability, it may be presumed that the existence of carbon nanotube much smaller than linear scratches 122 in and between the linear scratches 122 makes the electromagnetic wave-absorbing structure finer, resulting in improved electromagnetic wave absorbability with more uniformity. Because both linear scratches 122 and carbon nanotube are distributed randomly with random sizes, non-uniform electromagnetic wave-absorbing structures are formed microscopically, but the existence of numerous different electromagnetic wave-absorbing structures macroscopically provides uniform electromagnetic wave absorbability.

The thin carbon nanotube layer 14 is formed by applying a carbon nanotube dispersion to the thin metal film 12 having linear scratches 122, and spontaneously drying it. The concentration of carbon nanotube in the dispersion is preferably 0.1-2% by mass. When the concentration of carbon nanotube is less than 0.1% by mass, a sufficient amount of carbon nanotube cannot be applied. On the other hand, when it is more than 2% by mass, carbon nanotube is likely aggregated in the dispersion, failing to provide a uniform thin carbon nanotube layer. The more preferred concentration of carbon nanotube is 0.2-1% by mass. When carbon nanotube is sufficiently long, the carbon nanotube dispersion may contain a binder resin. Also, the carbon nanotube dispersion may contain a dispersant, which has substantially no influence on the conductivity of carbon nanotube.

In order that the thin carbon nanotube layer 14 is as thick as 0.01-0.5 g/m², the amount of the carbon nanotube dispersion applied is determined depending on its concentration. Solvents for dispersing carbon nanotube are not restrictive as long as they are well volatile, preferably for example, water, methanol, ethanol, isopropyl alcohol, benzene, toluene, methyl ethyl ketone, etc. Though not restrictive, the applying method of the carbon nanotube dispersion is preferably an inkjet printing method for forming a thin uniform layer 14, etc. The application of the carbon nanotube dispersion need not be conducted by one operation, but may be conducted plural times to obtain as uniform a thin carbon nanotube layer 14 as possible.

(2) Protective Layer

Figure 7A:
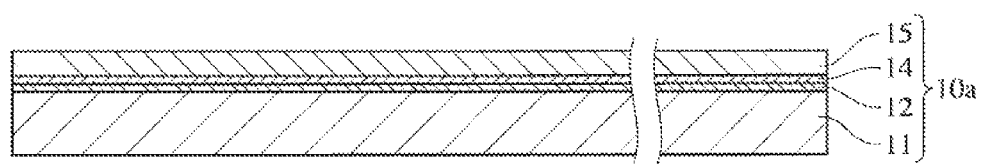
FIG. 7(a) is a cross-sectional view showing one example of third electromagnetic-wave-absorbing films provided on a thin metal film surface with a thin carbon nanotube layer and further a protective layer.
Figure 7B:
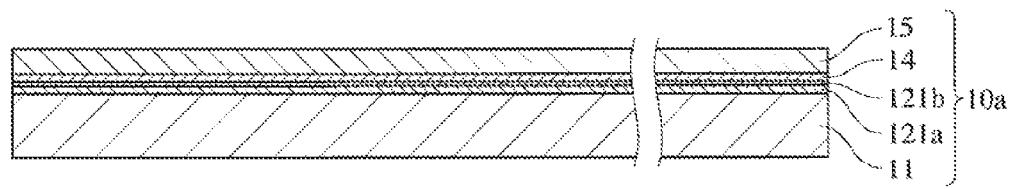
FIG. 7(b) is a cross-sectional view showing another example of third electromagnetic-wave-absorbing films provided on a thin metal film surface with a thin carbon nanotube layer and further a protective layer.

To make the handling of the first electromagnetic-wave-absorbing film 10a easier, and to protect the thin metal film 12 and the thin carbon nanotube layer 14, a protective plastic layer 15 may be formed on the thin metal film 12 as shown in FIGS. 7(a) and 7(b). A plastic film for the protective plastic layer 15 may be the same as a base plastic film 11. The thickness of the protective layer 15 is preferably about 5-30 pun, more preferably about 10-20 μm. The protective plastic layer 15 is preferably formed by the heat lamination of a plastic film. When the plastic film for the protective plastic layer is a PET film, a heat lamination temperature may be 110-150° C.

[3] Third Composite Electromagnetic-Wave-Absorbing Sheet

Figure 3:
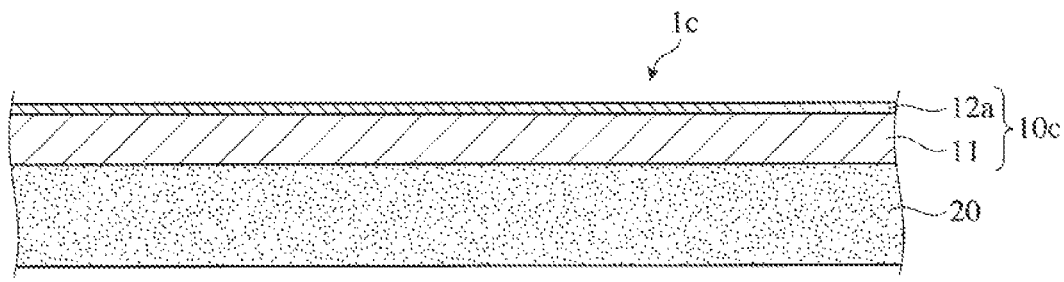
FIG. 3 is a partial cross-sectional view showing the third composite electromagnetic-wave-absorbing sheet of the present invention.

As shown in FIG. 3, the third composite electromagnetic-wave-absorbing sheet 1c differs from the first composite electromagnetic-wave-absorbing sheet 1a, in that a fourth electromagnetic-wave-absorbing film 10c is used in place of the first electromagnetic-wave-absorbing film 10a. Thus, the fourth electromagnetic-wave-absorbing film 10c will be explained in detail below.

(1) Magnetic Thin Metal Film

Figure 13:
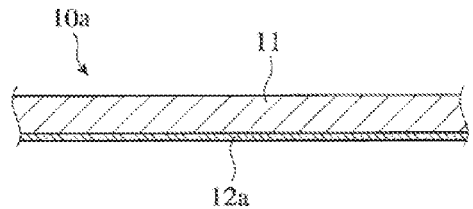
FIG. 13 is a cross-sectional view showing a fourth electromagnetic-wave-absorbing film used in the third composite electromagnetic-wave-absorbing sheet of the present invention.

As shown in FIG. 13, the fourth electromagnetic-wave-absorbing film 10c is obtained by forming a magnetic metal film 12a on a surface of the plastic film 11 by a vapor deposition method thin, and then heat-treating it at a temperature in range of 110-180° C., (a) the thin magnetic metal film 12a having light transmittance of 3-50% to a laser ray having wavelength of 660 nm, and (b) the thin magnetic metal film 12a having surface resistance of 10-200 Ω/square when measured under a load of 3.85 kg applied via a flat pressure plate, with a pair of electrodes each having a length completely covering a side of the test piece disposed on opposing side portions of the thin magnetic metal film of a square test piece of 10 cm×10 cm cut out of the fourth electromagnetic-wave-absorbing film 10c.

Magnetic metals for the thin magnetic metal film 12a include Ni, Fe, Co and their alloys, and Ni or its alloys are preferable from the aspect of the easiness of vapor deposition, conductivity and permeability. The thin magnetic metal film 12a can be formed by known methods such as a sputtering method, a vacuum vapor deposition method, etc.

(a) Light Transmittance

Figure 14:
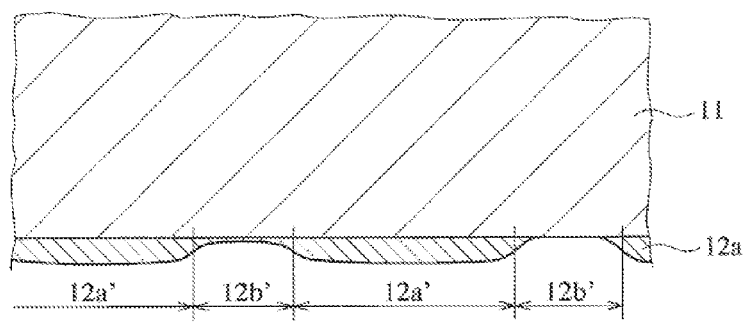
FIG. 14 is a partial cross-sectional view showing the details of a thin magnetic metal film in the fourth electromagnetic-wave-absorbing film shown in FIG. 13.

Because the thin magnetic metal film 12a is extremely thin, its thickness is uneven as shown in FIG. 14, having thick regions 12a' and thin or metal-free regions 12b'. Accordingly, it is difficult to measure the thickness of the thin magnetic metal film 12a accurately. Thus, the thickness of the thin magnetic metal film 12a is expressed by the transmittance of a laser ray having a wavelength of 660 nm (simply called "light transmittance") in the present invention. The light transmittance is determined by averaging values measured at pluralities of arbitrary points of the thin magnetic metal film 12a. When measured at 5 or more points, the average value of light transmittance is stabilized. A plastic film 11 as thin as 30 μm or less has light transmittance of almost 100%, making the light transmittance of the fourth electromagnetic-wave-absorbing film 10c equal to that of the thin magnetic metal film 12a. However, when the plastic film 11 is thicker than that, the light transmittance of the thin magnetic metal film 12a is obtained by subtracting the light transmittance of the plastic film 11 from the light transmittance of the fourth electromagnetic-wave-absorbing film 10c.

The light transmittance of the thin magnetic metal film 12a should be in a range of 3-50%. When the light transmittance is less than 3%, the thin magnetic metal film 12a is too thick, functioning like a metal foil, resulting in high reflectance of electromagnetic waves and low absorbability of electromagnetic wave noises. On the other hand, when the light transmittance is more than 50%, the thin magnetic metal film 12a is too thin, resulting in insufficient electromagnetic wave absorbability. The light transmittance of the thin magnetic metal film 12a is preferably 5-45%, more preferably 8-30%.

(b) Surface Resistance

It has been found that the surface resistance of a thin magnetic metal film 12a having light transmittance of 3-50% largely varies depending on measurement methods. To have as close, uniform and large-in-area contact as possible between the thin magnetic metal film 12a and an electrode, the surface resistance is measured by a DC two-terminal method under pressure (simply called "under-pressure two-terminal method"), using an apparatus shown in FIG. 15. Specifically, a square test piece TP1 (10 cm×10 cm) of the fourth electromagnetic-wave-absorbing film 10c is placed with its thin magnetic metal film 12a above on a flat, hard, insulating surface, a pair of electrodes 16, 16 each comprising an electrode body 16a of 10 cm in length, 1 cm in width and 0.5 mm in thickness, and an electrode extension 16b of 1 cm in width and 0.5 mm in thickness extending from a center side of the electrode body 16a, are attached to opposing side portions of the square test piece TP1, a transparent acrylic plate 17 of 10 cm×10 cm×5 mm is placed on the test piece TP1 and both electrodes 16, 16, such that it completely covers them, and a cylindrical weight 18 (3.85 kg) of 10 cm in diameter is placed on the transparent acrylic plate 17, to measure current flowing between both electrode extensions 16b, 16b to determine the surface resistance.

The surface resistance of the heat-treated thin magnetic metal film 12a should be in a range of 10-200 Ω/square. When the surface resistance is less than 10 Ω/square, the thin magnetic metal film 12a is too thick, functioning like a metal foil, resulting in low absorbability of electromagnetic wave noises. On the other hand, when the surface resistance is more than 200 Ω/square, the thin magnetic metal film 12a is too thin to have sufficient electromagnetic wave absorbability. The surface resistance of the heat-treated thin magnetic metal film 12a is preferably 15-150 Ω/square, more preferably 20-120 Ω/square, most preferably 30-100 Ω/square.

(2) Heat Treatment

The extremely thin magnetic metal film 12a having light transmittance of 3-50% and surface resistance of 10-200 Ω/square is uneven in thickness as a whole as shown in FIG. 14, having relatively thick regions 12a' and relatively thin or thin-film-free regions 12b'. It is considered that the relatively thin regions 12b' act as magnetic gaps and high-resistance regions, attenuating magnetic flux and current generated in the thin magnetic metal film 12a by near-field noises. It has been found, however, that because the structure of such thin magnetic metal film 12a largely differs depending on production conditions, it is extremely difficult to stably form a thin magnetic metal film 12a having constant light transmittance and surface resistance. Intensive research has revealed that when a thin magnetic metal film 12a formed by a vapor deposition method is heat-treated at a temperature of higher than 100° C., at which the heat shrinkage of a plastic film 11 is likely to occur, the surface resistance of the thin magnetic metal film 12a is stabilized with slight decrease, and subject to substantially no change with time. The heat treatment of a heat-shrinkable plastic film such as a stretched polyethylene terephthalate film at a temperature exceeding 100° C. has not conventionally been contemplated at all. However, it has been found that a heat treatment at a temperature in a range of 110-180° C. for a short period of time (10 minutes to 1 hour) stabilizes the surface resistance of the thin magnetic metal film 12a with slight decrease, thereby stabilizing electromagnetic wave noise absorbability, though the plastic film 11 is slightly heat-shrunk. The stabilization of electromagnetic wave noise absorbability means not only that the electromagnetic wave noise absorbability is subject to substantially no change with time, but also that there is reduced unevenness depending on production conditions and among production lots.

The surface resistance can be adjusted by changing heat treatment conditions. For example, when a thin magnetic metal film 12a has high surface resistance, a higher heat treatment temperature or a longer heat treatment time reduces the surface resistance to a desired level. Oppositely, when the thin magnetic metal film 12a has low surface resistance, a lower heat treatment temperature or a shorter heat treatment time suppresses decrease in the surface resistance.

It has been found that even among vapor-deposited films having the same surface resistance, there is large difference in electromagnetic wave absorbability between those free from a heat treatment and those heat-treated, and that vapor-deposited films adjusted to have desired surface resistance by a heat treatment have higher electromagnetic wave absorbability. The reasons therefor are not clear, because it is extremely difficult to evaluate the change of the state (particularly metal structure) of an extremely thin magnetic metal film by a heat treatment. Because experiment has revealed that the electromagnetic wave absorbability of a thin magnetic metal film changes with a heat treatment temperature, the structural condition of the thin magnetic metal film in the present invention is defined by the heat treatment temperature.

The heat treatment temperature is in a range of 110-180° C. When the heat treatment temperature is lower than 110° C., the heat treatment has substantially no effect of improving the electromagnetic wave absorbability with reduced unevenness. On the other hand, when the heat treatment temperature is higher than 180° C., the thin magnetic metal film 12a is surface-oxidized, and the plastic film having no sufficient heat resistance shrinks too much. The heat treatment temperature is preferably 120-170° C., more preferably 130-160° C. The heat treatment time is preferably 10 minutes to 1 hour, more preferably 20-40 minutes, though variable depending on the heat treatment temperature.

A protective film is preferably laminated on the heat-treated thin magnetic metal film 12a, to protect the thin magnetic metal film 12a with enough insulation. The protective film may be the same as the plastic film 11.

Figure 16A:
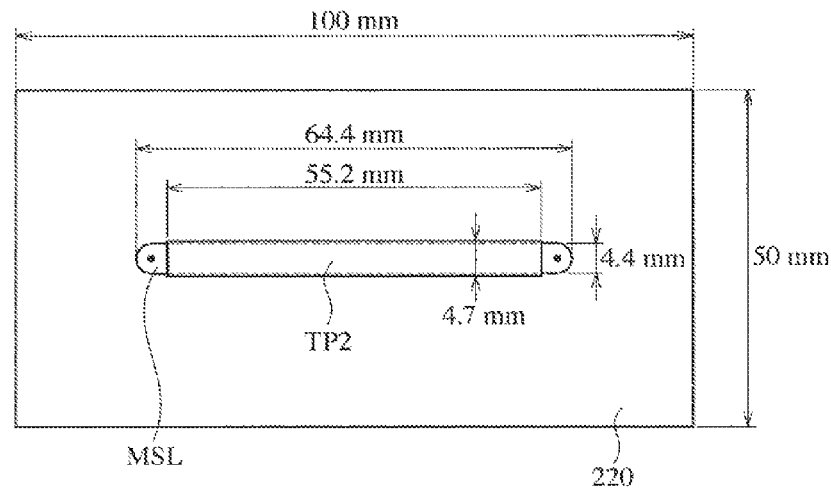
FIG. 16(a) is a plan view showing a system for evaluating the electromagnetic wave absorbability of a composite electromagnetic-wave-absorbing sheet.
Figure 16B:
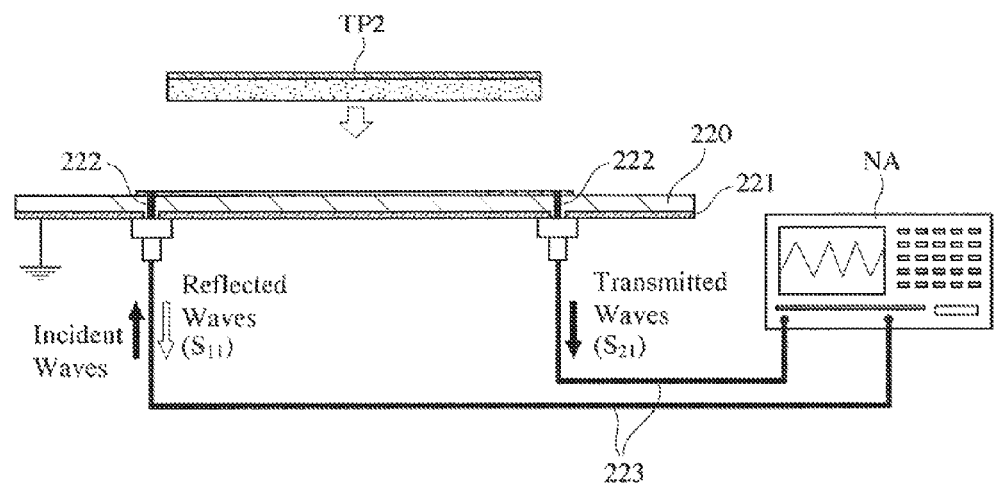
FIG. 16(b) is a partially cross-sectional front view showing a system for evaluating the electromagnetic wave absorbability of a composite electromagnetic-wave-absorbing sheet.

[4] Electromagnetic Wave Absorbability of Electromagnetic-Wave-Absorbing Film (1) Transmission Attenuation Power Ratio Using a system comprising a microstripline MSL (64.4 mm×4.4 mm) of 50Ω, an insulating substrate 220 supporting the microstripline MSL, a grounded electrode 221 attached to a lower surface of the insulating substrate 220, conductor pins 222, 222 connected to both edges of the microstripline MSL, a network analyzer NA, and coaxial cables 223, 223 for connecting the network analyzer NA to the conductor pins 222, 222 as shown in FIGS. 16(a) and 16(b), with a test piece TP2 of the composite electromagnetic-wave-absorbing sheet attached to the microstripline MSL by an adhesive, reflected wave power $S_{11}$ and transmitted wave power $S_{21}$ are measured with incident waves of 0.1-6 GHz, to determine the transmission attenuation ratio Rtp by the following formula (1):

$$Rtp = -10 \times \log [10^{S21/10}/(1-10^{S11/10})] \quad (1).$$

(2) Noise Absorption Ratio

In the system shown in FIGS. 16(a) and 16(b), there is a relation expressed by [incident power $P_{in}$=reflected wave power $S_{11}$+transmitted wave power $S_{21}$+absorbed power (power loss) $P_{loss}$]. Accordingly, the power loss $P_{loss}$ is determined by subtracting the reflected wave power $S_{11}$ and the transmitted wave power $S_{21}$ from the incident power $P_{in}$, and the noise absorption ratio $P_{loss}/P_{in}$ is determined by dividing $P_{loss}$ by the incident power $P_{in}$.

(3) Intra-Decoupling Ratio

Figure 17:
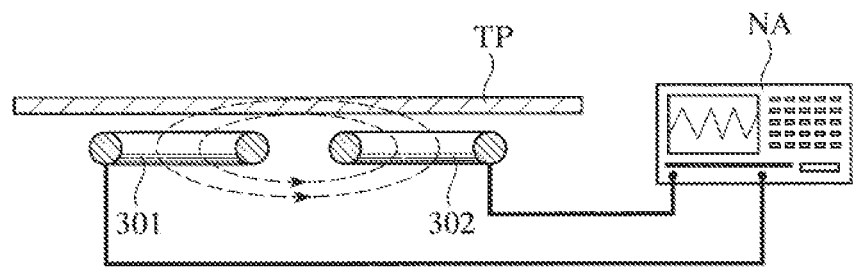
FIG. 17 is a partially cross-sectional schematic view showing a method for measuring the intra-decoupling ratio of a composite electromagnetic-wave-absorbing sheet.

The intra-decoupling ratio Rda indicates to what extent coupling in the same printed circuit board is attenuated by a noise suppression sheet. As shown in FIG. 17, it is determined from an attenuation ratio measured when high-frequency signals of 0-6 GHz are transmitted from one loop antenna 301 to another loop antenna 302, with a test piece TP of a noise suppression sheet disposed near a pair of loop antennas 301, 302 connected to a network analyzer NA.

(4) Inter-Decoupling Ratio

Figure 18:
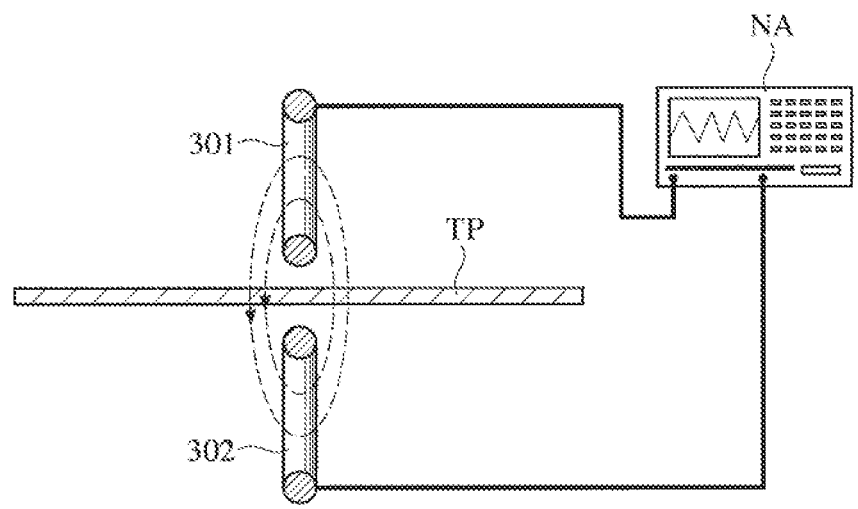
FIG. 18 is a partially cross-sectional schematic view showing a method for measuring the inter-decoupling ratio of a composite electromagnetic-wave-absorbing sheet.

The inter-decoupling ratio Rde indicates to what extent coupling between two printed circuit boards or parts is attenuated by a noise suppression sheet. As shown in FIG. 18, it is determined from an attenuation ratio measured when high-frequency signals of 0-6 GHz are transmitted from one loop antenna 301 to another loop antenna 302, with a test piece TP of a noise suppression sheet between a pair of loop antennas 301, 302 connected to a network analyzer NA.

The present invention will be explained in more detail with Examples below without intention of restricting the present invention thereto.

Reference Example 1

Using an apparatus having the structure shown in FIG. 12, which comprised pattern rolls 32a, 32b each having fine diamond particles having a particle size distribution of 50-80 μm electrodeposited on the surface, linear scratches 122a', 122b' were formed in two perpendicular directions as shown in FIG. 5(c), on a 0.05-μm-thick aluminum film 12 formed on a surface of a 16-μm-thick biaxially stretched polyethylene terephthalate (PET) film 11 by a vacuum vapor deposition method, to produce a first electromagnetic-wave-absorbing film 10a. It was found from the optical photomicrograph of the linearly scratched thin aluminum film 12 that the linear scratches 122a', 122b' had the following characteristics.

Range of widths W: 0.5-5 μm,
Average width Wav: 2 μm,
Range of intervals I: 2-30 μm,
Average interval Iav: 20 μm,
Average length Lav: 5 mm, and
Acute crossing angle θs: 90°.

Multi-layer carbon nanotube of 10-15 nm in outer diameter and 0.1-10 μm in length was dispersed in methyl ethyl ketone to prepare a carbon nanotube dispersion (concentration: 1% by mass, containing 1% by mass of a dispersant), and the carbon nanotube dispersion was applied by air brush to the linearly scratched thin aluminum film 12, and spontaneously dried. The resultant thin carbon nanotube layer 14 had a thickness (expressed by a coated amount) of 0.064 g/m². Thereafter, a protective layer 15 of a 16-μm-thick PET film was heat-laminated to the thin aluminum film 12 at 120° C., to obtain a sample of the third electromagnetic-wave-absorbing film 10b.

Figure 19:
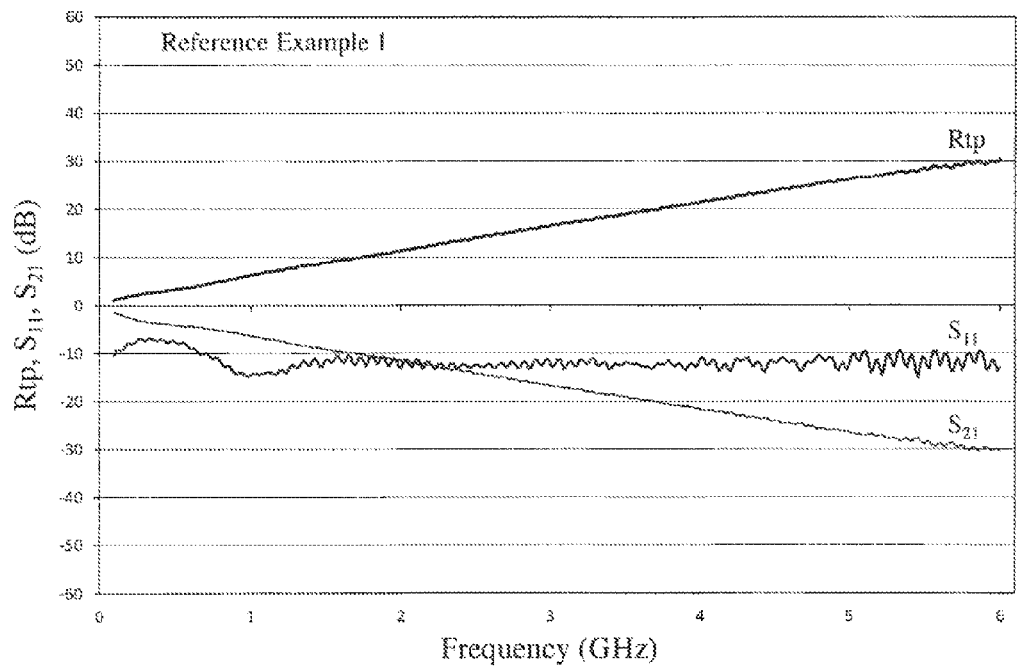
FIG. 19 is a graph showing the relation between a transmission attenuation power ratio Rtp, $S_{11}$ and $S_{21}$ and a frequency in the third electromagnetic-wave-absorbing film of Reference Example 1.
Figure 20:
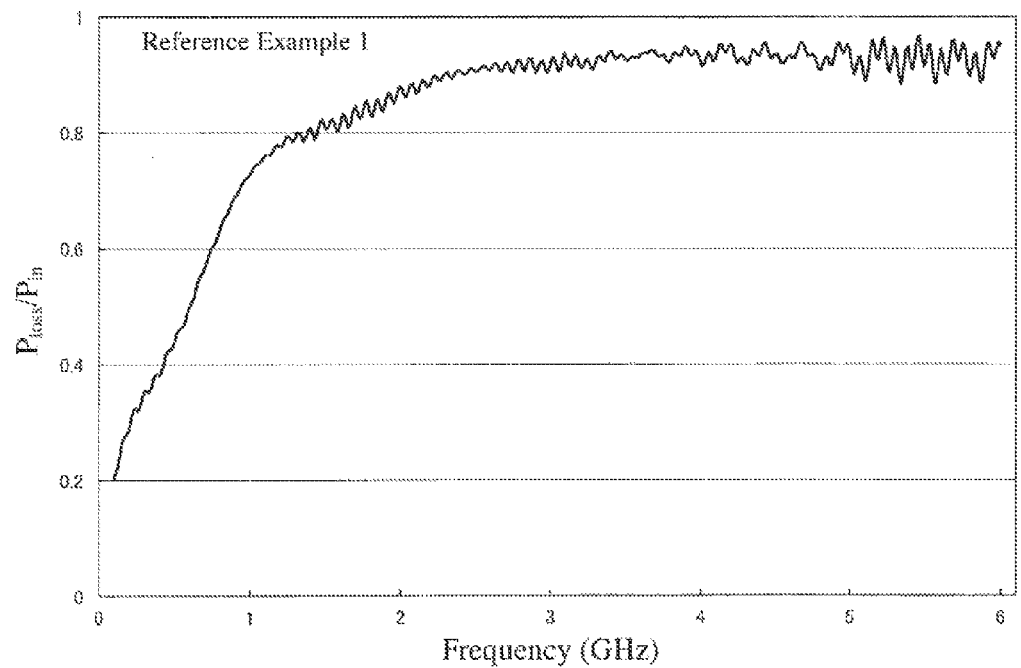
FIG. 20 is a graph showing the relation between a noise absorption ratio $P_{loss}/P_{in}$ and a frequency in the third electromagnetic-wave-absorbing film of Reference Example 1.

A test piece TP2 (55.2 mm×4.7 mm) cut out of the third electromagnetic-wave-absorbing film 10b was adhered to a microstripline MSL in the system shown in FIGS. 16(a) and 16(b), to measure reflected wave power $S_{11}$ and transmitted wave power $S_{21}$ relative to the incident power $P_{in}$ in a frequency range of 0.1-6 GHz. The transmission attenuation power ratio Rtp and the noise absorption ratio $P_{loss}/P_{in}$ in a frequency range of 0.1-6 GHz were determined by the methods described in Paragraph [4], (1) and (2). The transmission attenuation power ratio Rtp and the noise absorption ratio $P_{loss}/P_{in}$ are shown in FIGS. 19 and 20, respectively.

Figure 21:
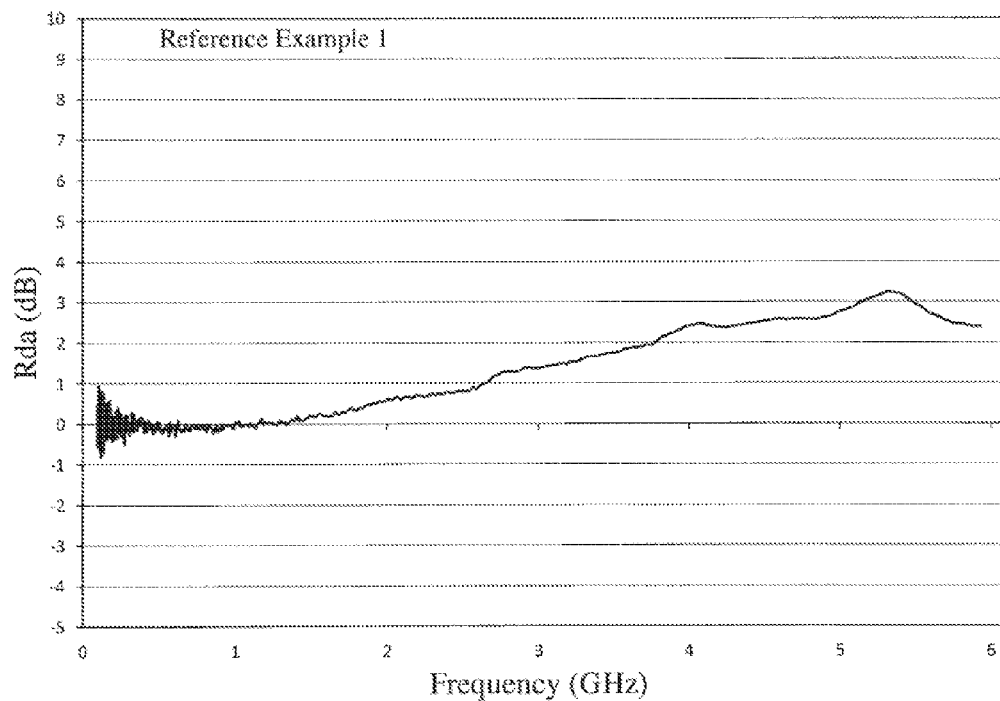
FIG. 21 is a graph showing the relation between an intra-decoupling ratio Rda and a frequency in the third electromagnetic-wave-absorbing film of Reference Example 1.
Figure 22:
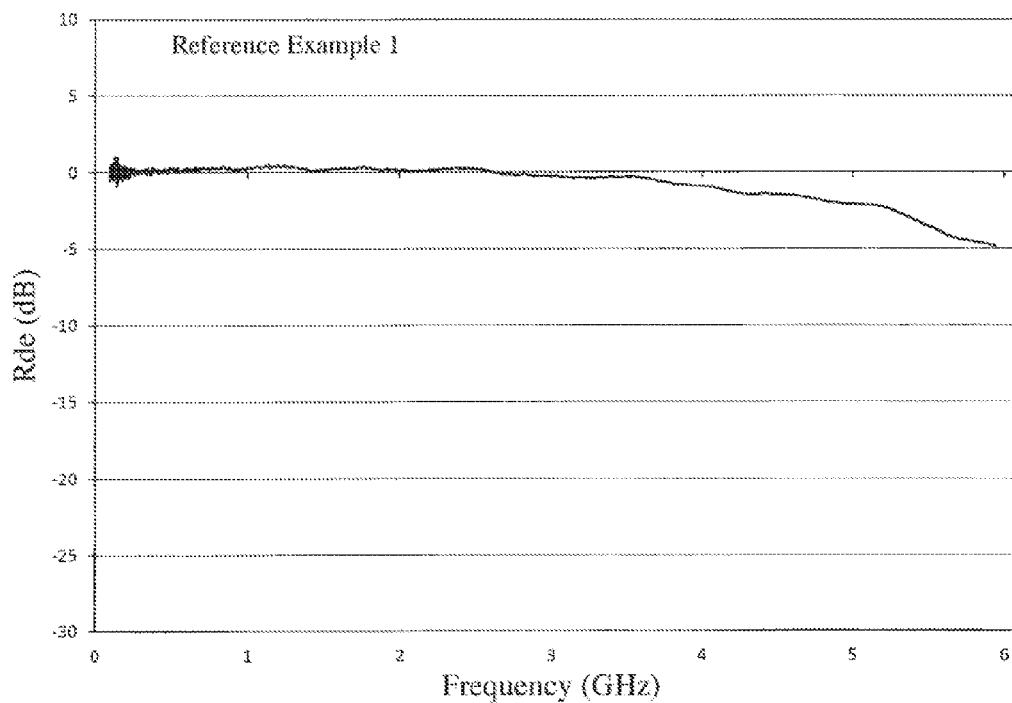
FIG. 22 is a graph showing the relation between an inter-decoupling ratio Rde and a frequency in the third electromagnetic-wave-absorbing film of Reference Example 1.

With a test piece TP of the third electromagnetic-wave-absorbing film 10b disposed on the apparatus shown in FIG. 17, an attenuation ratio was measured when high-frequency signals of 0-6 GHz were transmitted from one loop antenna 301 to another loop antenna 302, to determine the intra-decoupling ratio Rda. Further, with a test piece TP of the third electromagnetic-wave-absorbing film 10b disposed on the apparatus shown in FIG. 18, an attenuation ratio was measured when high-frequency signals of 0-6 GHz were transmitted from one loop antenna 301 to another loop antenna 302, to determine the inter-decoupling ratio Rde. The intra-decoupling ratio Rda and the inter-decoupling ratio Rde in a frequency range of 0-6 GHz are shown in FIGS. 21 and 22, respectively.

Reference Example 2

Figure 23A:
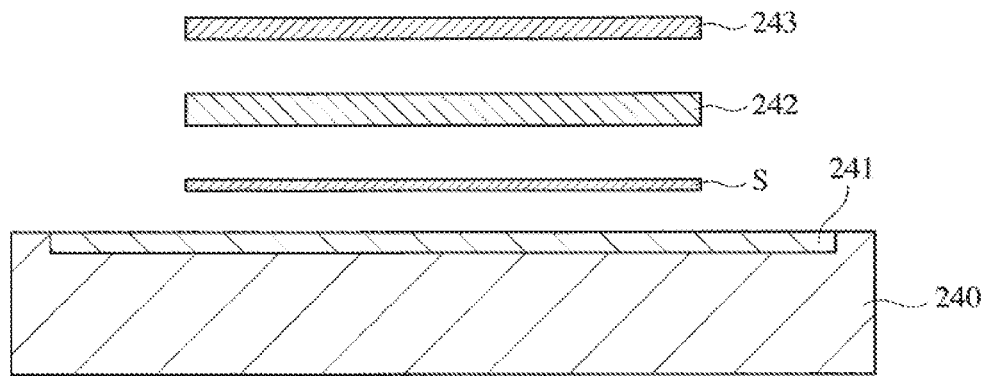
FIG. 23(a) is a cross-sectional view showing an apparatus for heat-treating a plastic film having a vapor-deposited thin magnetic metal film.
Figure 23B:
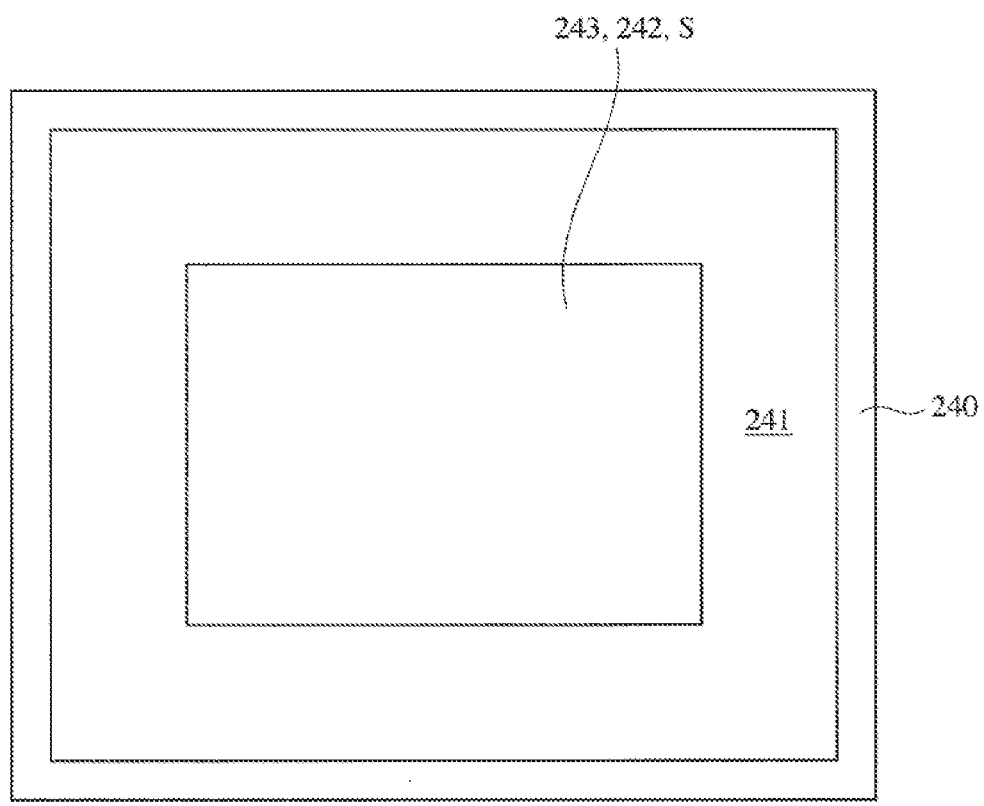
FIG. 23(b) is a plan view showing the heat treatment of a vapor-deposited magnetic metal film by the apparatus of FIG. 23(a).

A thin Ni film 12a having target light transmittance (wavelength: 660 nm) of 27.0% was formed on a 16-μm-thick polyethylene terephthalate (PET) film 11 by a vacuum vapor deposition method, to produce a long, vapor-deposited film. Samples S of an A4 size (210 mm×297 mm) were cut out of arbitrary portions of the long, vapor-deposited film, and each sample S was disposed with the thin Ni film 12a below on a hot plate 241 in a heating apparatus 240 as shown in FIGS. 23(a) and 23(b). With an A4-size, 3-mm-thick, Teflon (registered trademark)-made, heat-insulating sheet 242, and an A4-size, 2-mm-thick iron plate 243 placed thereon, a heat treatment was conducted at 150° C. for 30 minutes to obtain a fourth electromagnetic-wave-absorbing film 10c. The heat treatment caused heat shrinkage of about 1%.

Figure 15A:
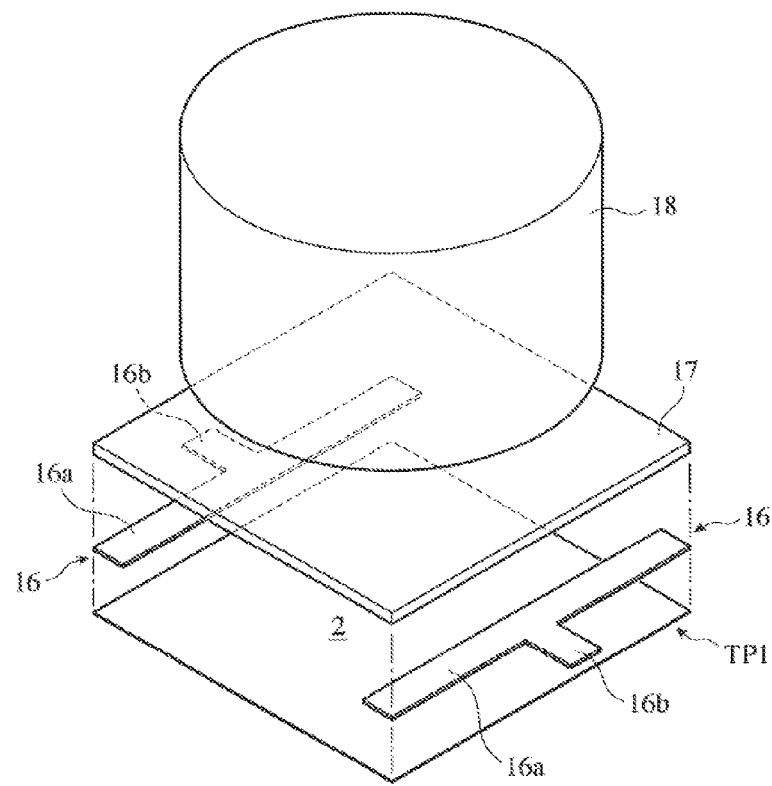
FIG. 15(a) is a perspective view showing an apparatus for measuring the surface resistance of a thin metal film.
Figure 15B:
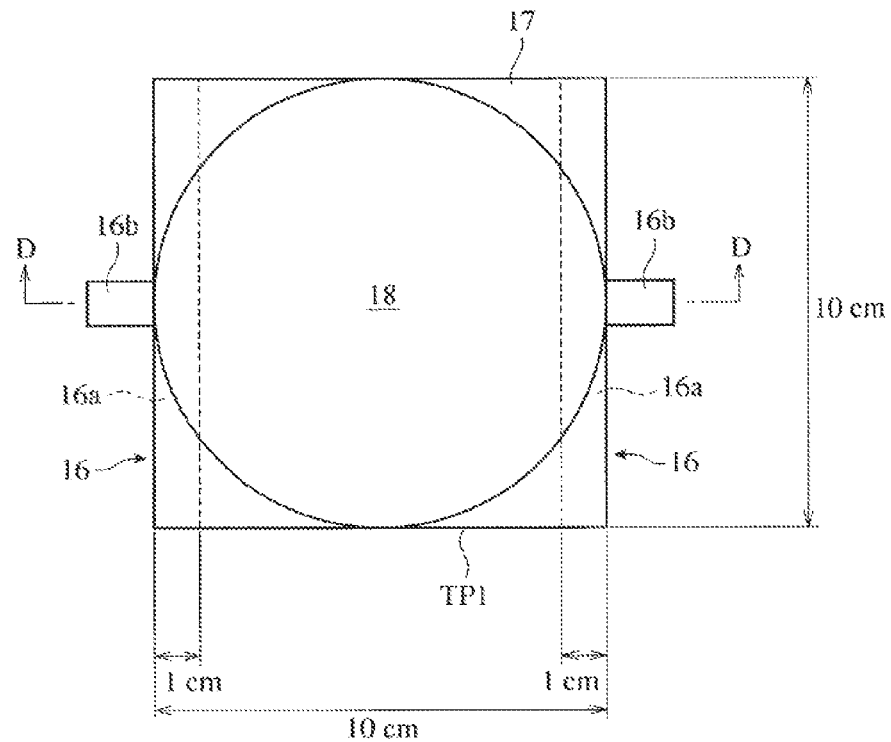
FIG. 15(b) is a plan view showing the measurement of the surface resistance of a thin metal film by the apparatus of FIG. 15(a).
Figure 15C:
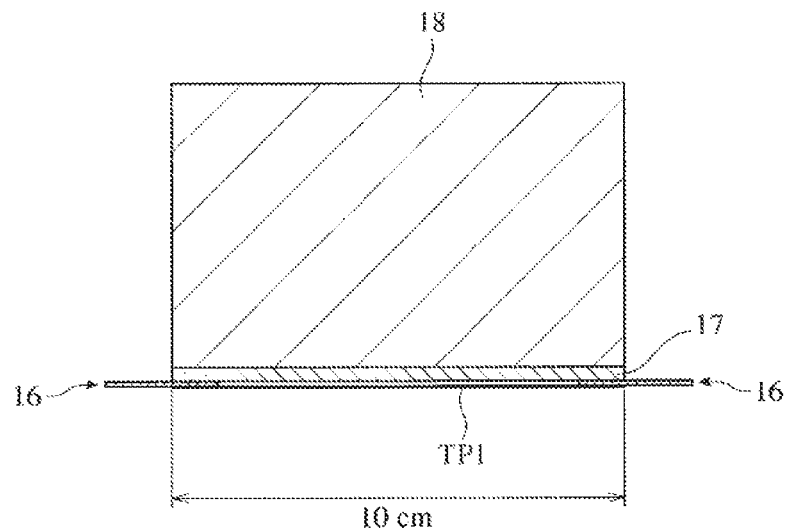
FIG. 15(c) is a cross-sectional view taken along the line D-D in FIG. 15(b).

A test piece TP1 of 10 cm×10 cm was cut out of the fourth electromagnetic-wave-absorbing film 10c. Using a transmission-type laser sensor (IB-05) available from Keyence Corporation, the light transmittance of the test piece TP1 at five arbitrary points was measured by a laser ray having wavelength of 660 nm, and averaged. The surface resistance of the test piece TP1 was measured by the under-pressure two-terminal method as shown in FIG. 15. Each electrode 16 was constituted by an electrode body 16a of 10 cm in length, 1 cm in width and 0.5 mm in thickness, and an electrode extension 16b of 1 cm in width and 0.5 mm in thickness. The transparent acrylic plate 17 was 10 cm×10 cm×5 mm in thickness, and the cylindrical weight 18 as heavy as 3.85 kg had a diameter of 10 cm. With both electrodes 16, 16 connected to a resistance meter (type: 3565) available from Tsuruga Electric Corporation, the surface resistance was determined from the measured current. As a result, the average light transmittance of the test piece TP1 was 26.7%. The average surface resistance was 100-110 Ω/square before the heat treatment, and 90 Ω/square after the heat treatment.

Figure 24:
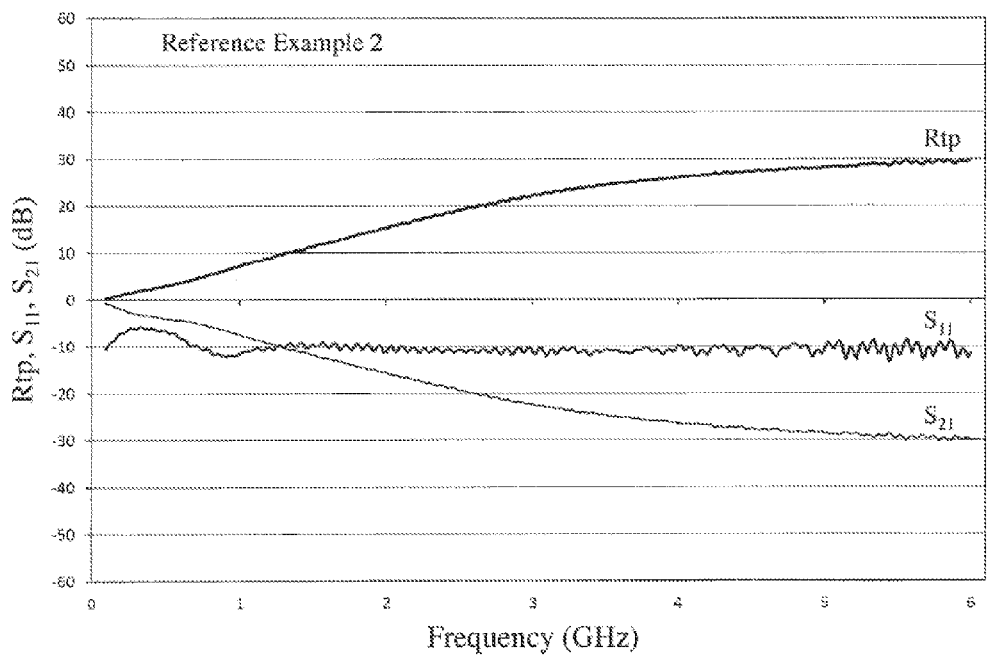
FIG. 24 is a graph showing the relation between a transmission attenuation power ratio Rtp, $S_{11}$ and $S_{21}$ and a frequency in the fourth electromagnetic-wave-absorbing film of Reference Example 2.
Figure 25:
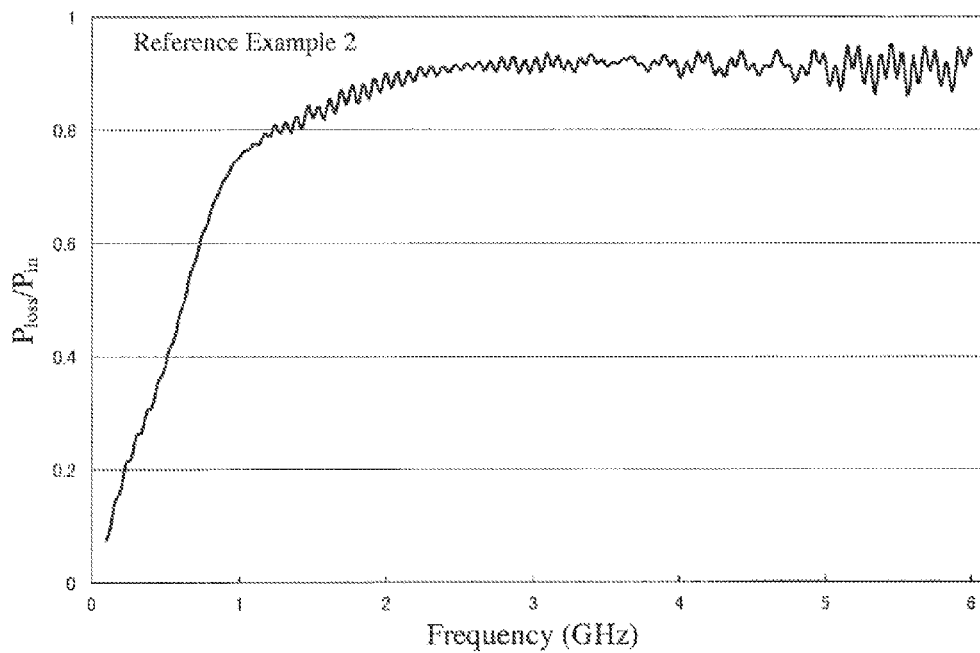
FIG. 25 is a graph showing the relation between a noise absorption ratio $P_{loss}/P_{in}$ and a frequency in the fourth electromagnetic-wave-absorbing film of Reference Example 2.

A test piece TP2 (55.2 mm×4.7 mm) cut out of the fourth electromagnetic-wave-absorbing film 10c was adhered to a microstripline MSL in the system shown in FIGS. 16(a) and 16(b), and measured with respect to reflected wave power $S_{11}$ and transmitted wave power $S_{21}$ in a frequency range of 0.1-6 GHz. The transmission attenuation power ratio Rtp and the noise absorption ratio $P_{loss}/P_{in}$ in a frequency range of 0.1-6 GHz were determined by the methods described in Paragraph [4], (1) and (2). The transmission attenuation power ratio Rtp and the noise absorption ratio $P_{loss}/P_{in}$ are shown in FIGS. 24 and 25, respectively.

Figure 26:
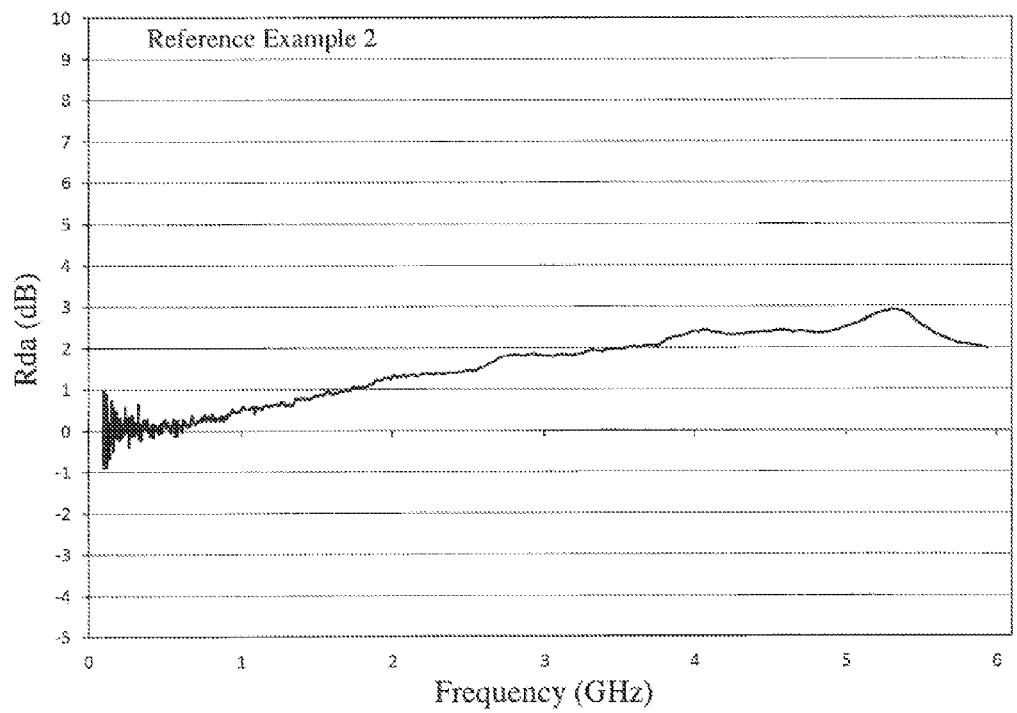
FIG. 26 is a graph showing the relation between an intra-decoupling ratio Rda and a frequency in the fourth electromagnetic-wave-absorbing film of Reference Example 2.
Figure 27:
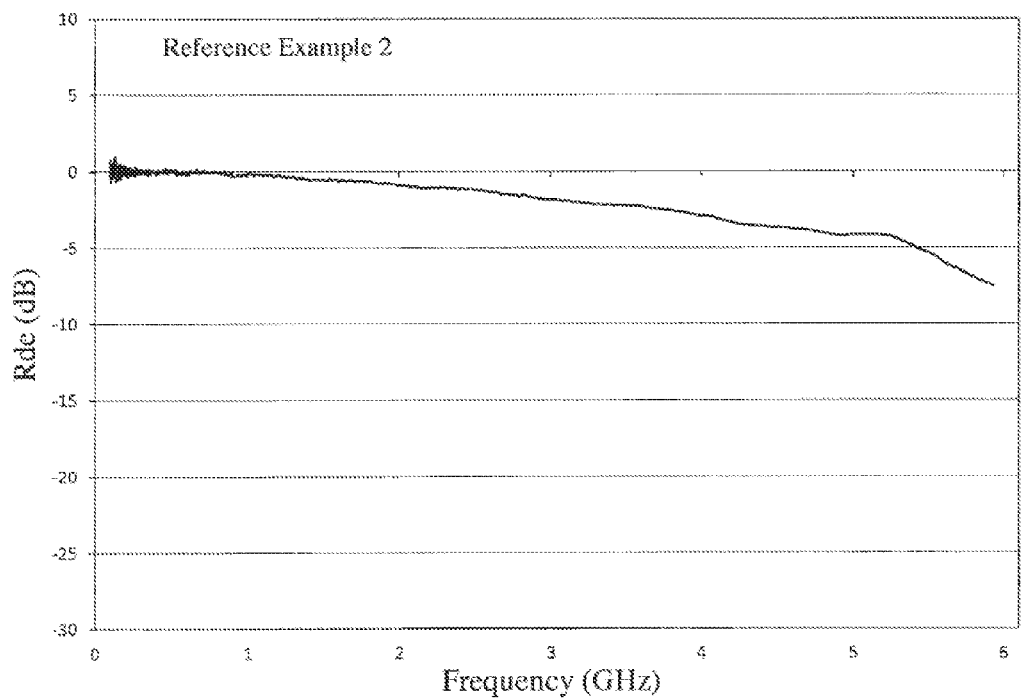
FIG. 27 is a graph showing the relation between an inter-decoupling ratio Rde and a frequency in the fourth electromagnetic-wave-absorbing film of Reference Example 2.
Figure 28:
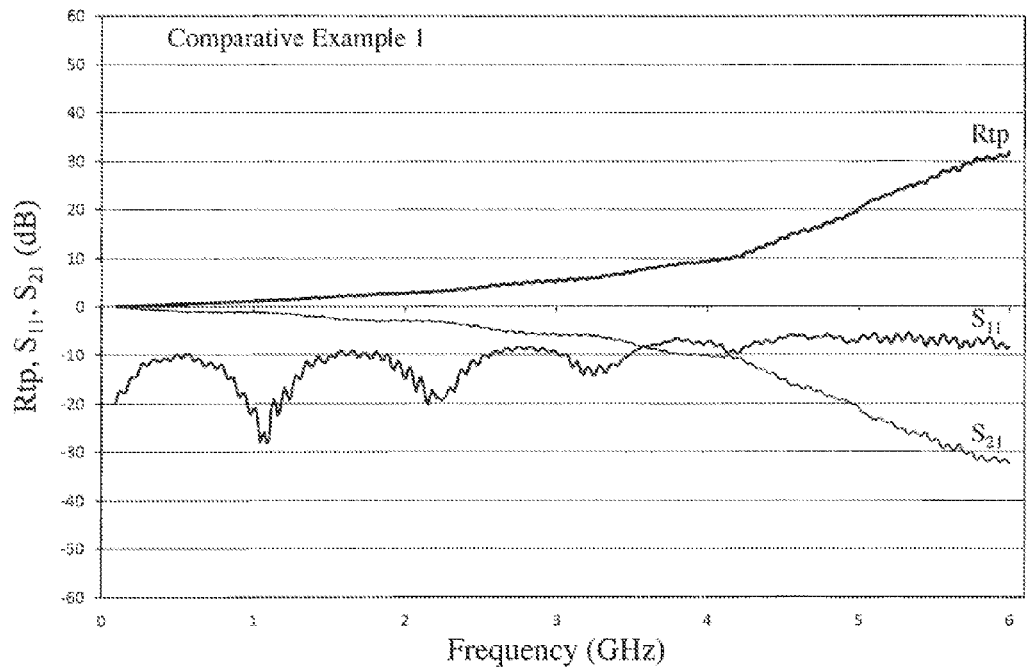
FIG. 28 is a graph showing the relation between a transmission attenuation power ratio Rtp, $S_{11}$ and $S_2$, and a frequency in the magnetic noise suppression sheet of Comparative Example 1 (the second electromagnetic-wave-absorbing film).
Figure 29:
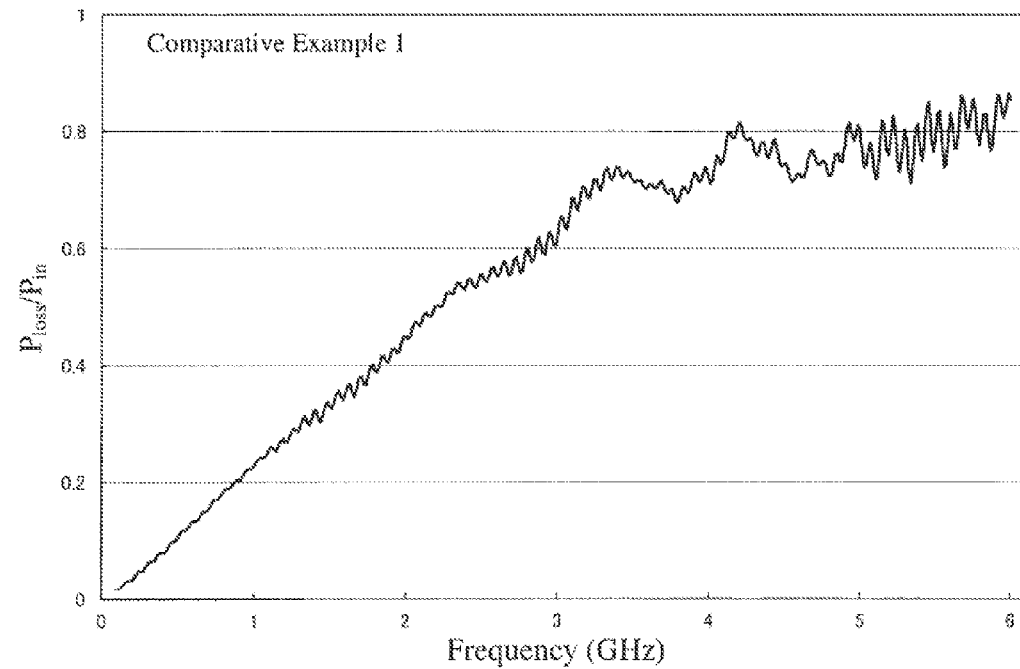
FIG. 29 is a graph showing the relation between a noise absorption ratio $P_{loss}/P_{in}$ and a frequency in the magnetic noise suppression sheet of Comparative Example 1 (the second electromagnetic-wave-absorbing film).
Figure 30:
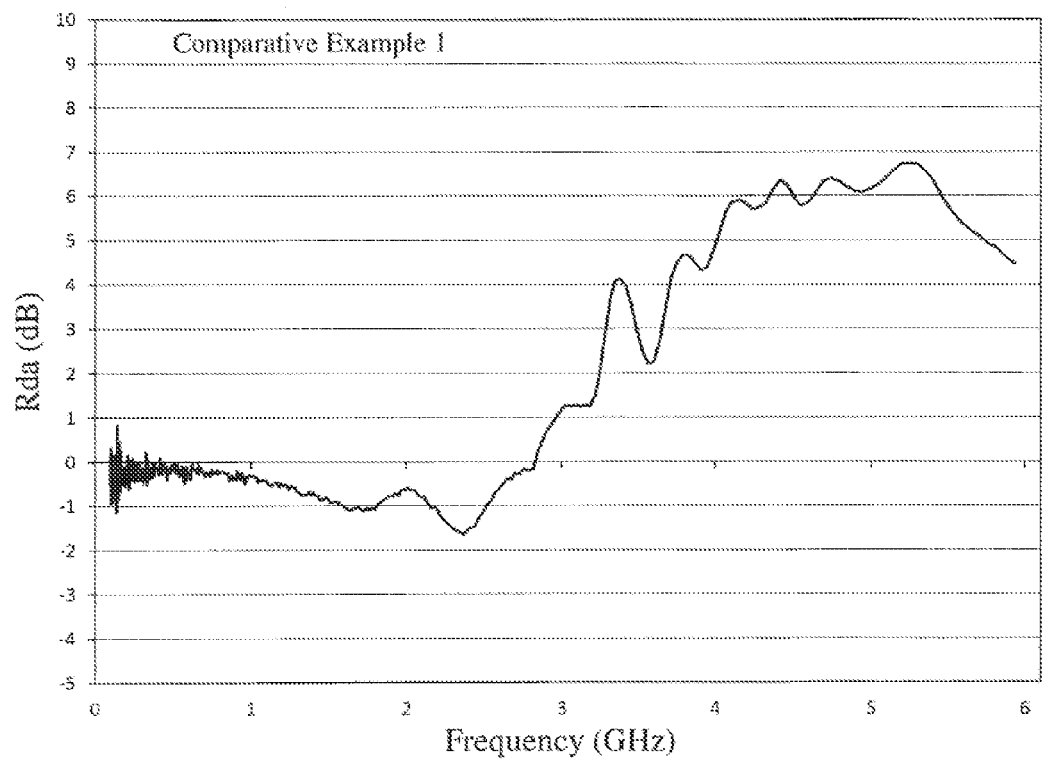
FIG. 30 is a graph showing the relation between an intra-decoupling ratio Rda and a frequency in the magnetic noise suppression sheet of Comparative Example 1 (the second electromagnetic-wave-absorbing film).
Figure 31:
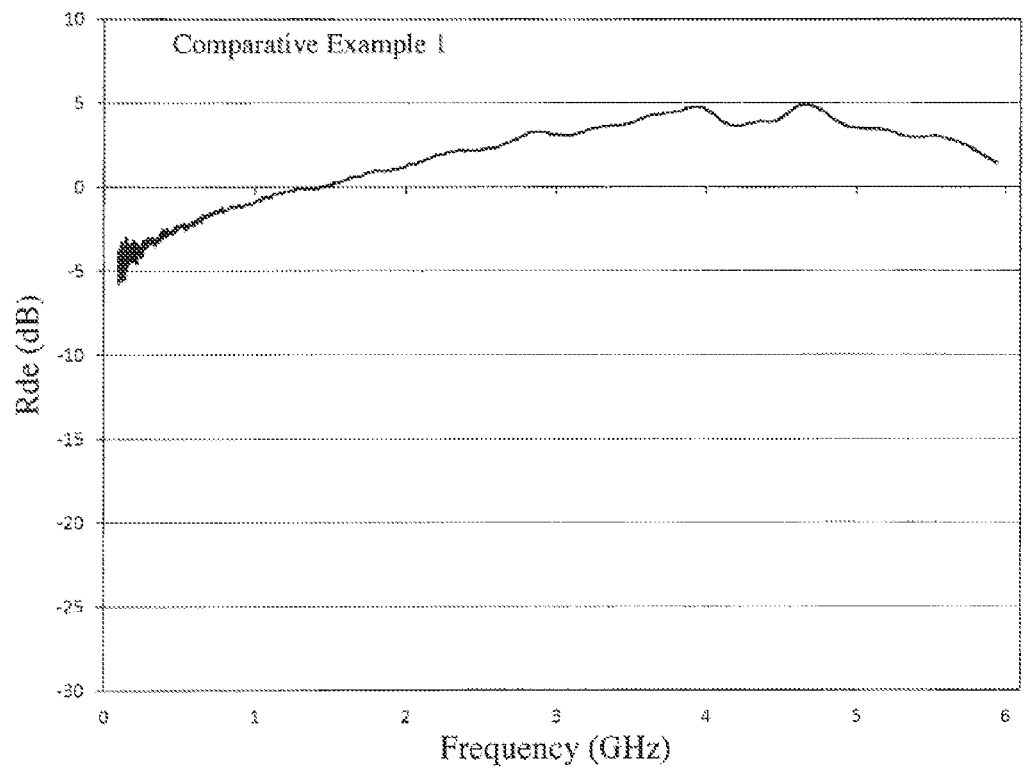
FIG. 31 is a graph showing the relation between an inter-decoupling ratio Rde and a frequency in the magnetic noise suppression sheet of Comparative Example 1 (the second electromagnetic-wave-absorbing film).
Figure 32:
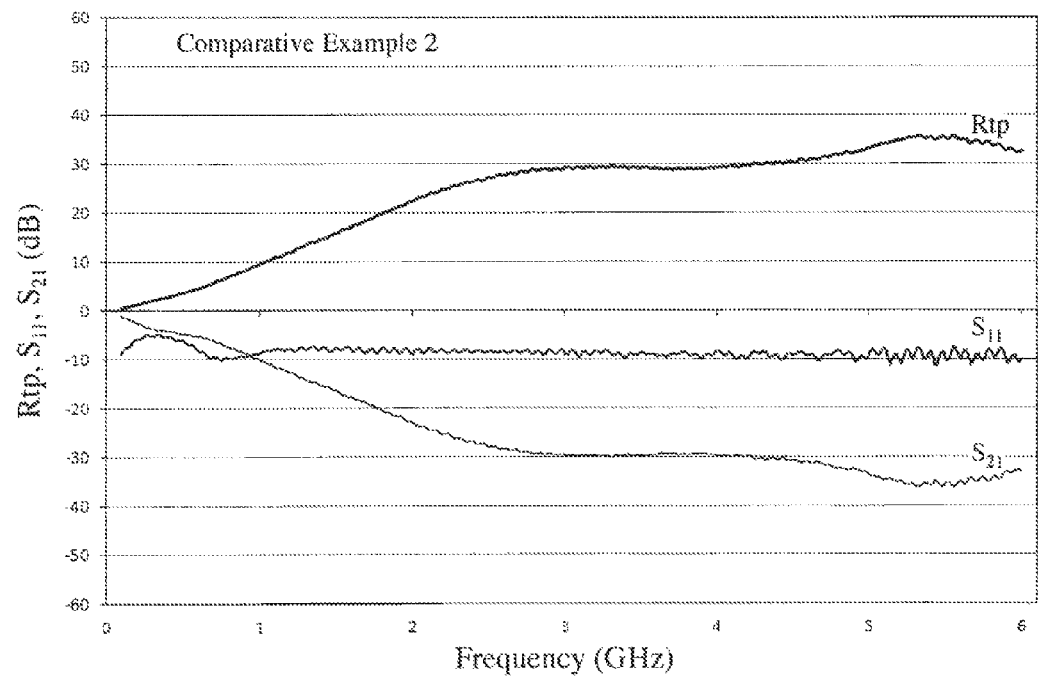
FIG. 32 is a graph showing the relation between a transmission attenuation power ratio Rtp, $S_{11}$ and $S_2$, and a frequency in the magnetic noise suppression sheet of Comparative Example 2 (the second electromagnetic-wave-absorbing film).
Figure 33:
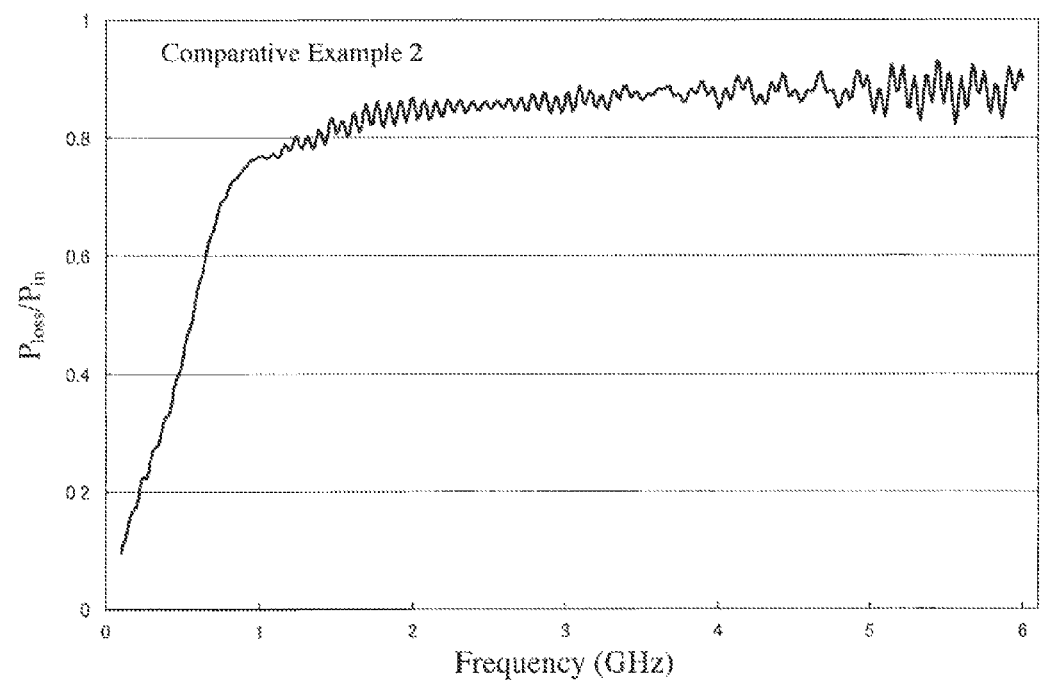
FIG. 33 is a graph showing the relation between a noise absorption ratio $P_{loss}/P_{in}$ and a frequency in the magnetic noise suppression sheet of Comparative Example 2 (the second electromagnetic-wave-absorbing film).
Figure 34:
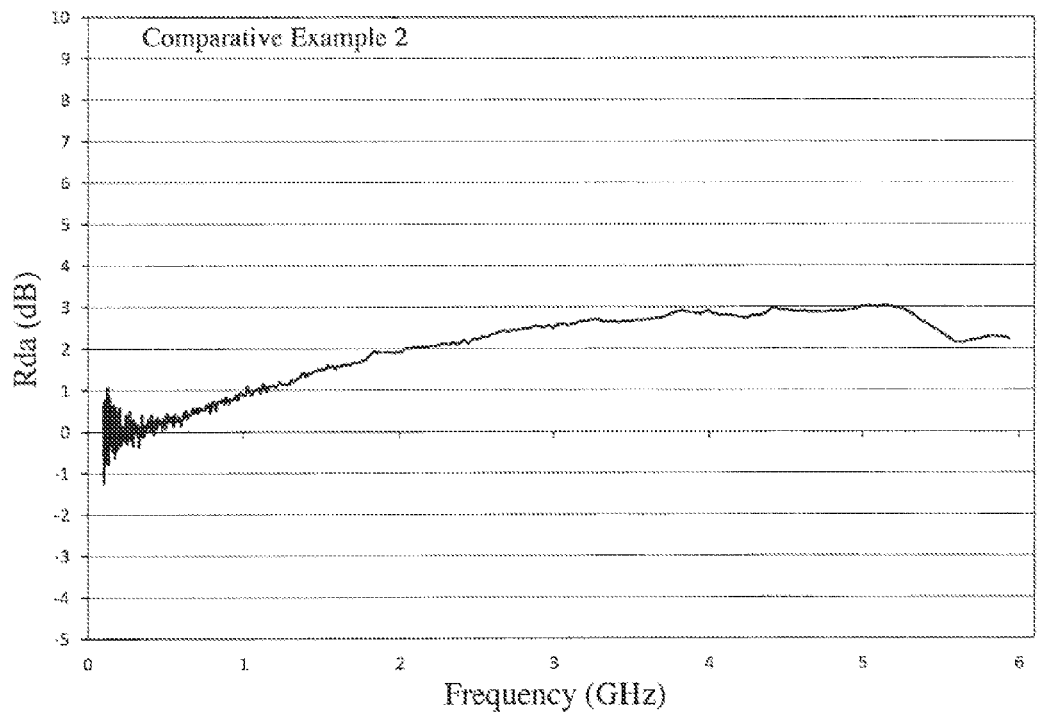
FIG. 34 is a graph showing the relation between an intra-decoupling ratio Rda and a frequency in the magnetic noise suppression sheet of Comparative Example 2 (the second electromagnetic-wave-absorbing film).
Figure 35:
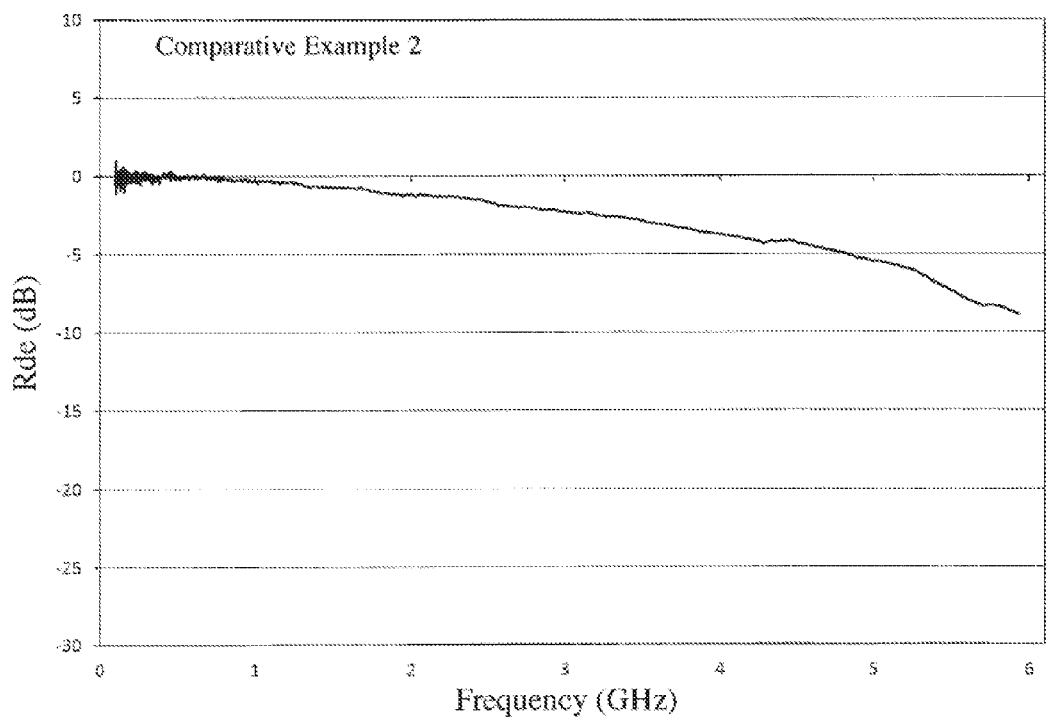
FIG. 35 is a graph showing the relation between an inter-decoupling ratio Rde and a frequency in the magnetic noise suppression sheet of Comparative Example 2 (the second electromagnetic-wave-absorbing film).
Figure 36:
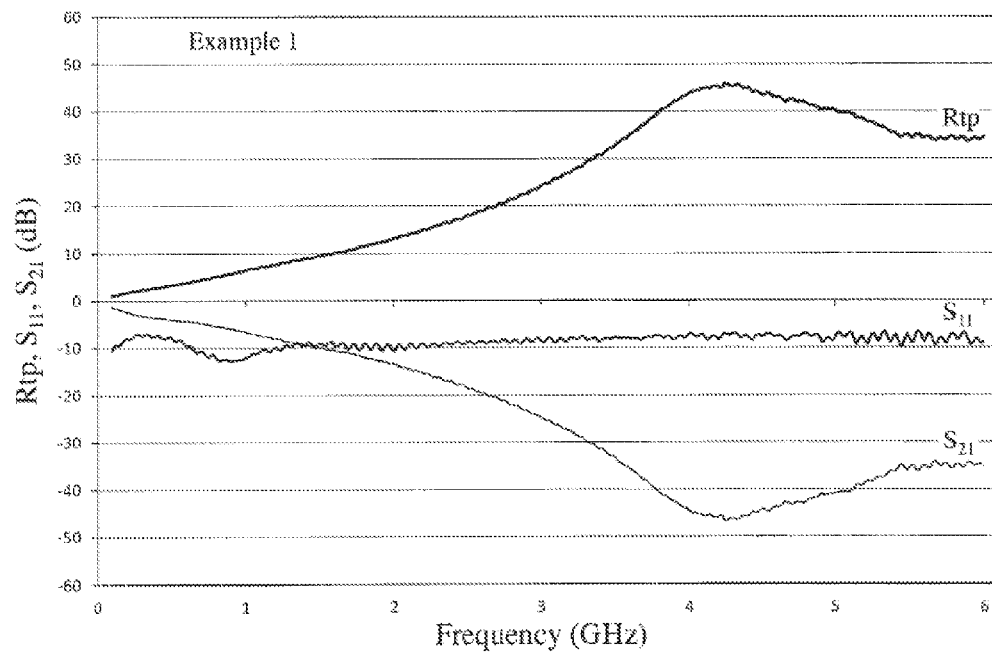
FIG. 36 is a graph showing the relation between a transmission attenuation power ratio Rtp, $S_{11}$ and $S_{21}$ and a frequency in the second composite electromagnetic-wave-absorbing sheet of Example 1.
Figure 37:
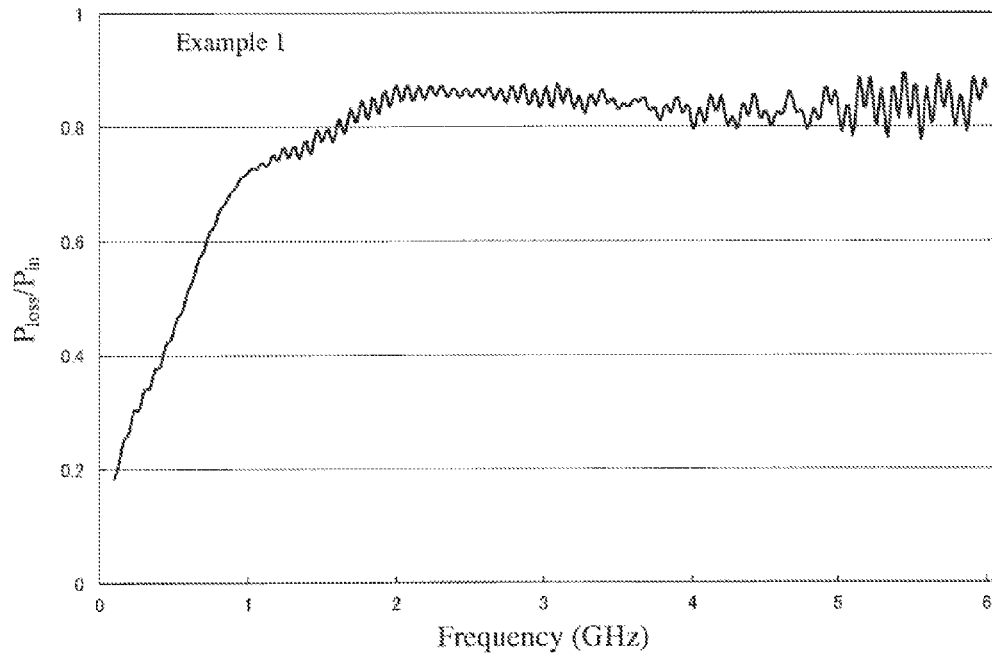
FIG. 37 is a graph showing the relation between a noise absorption ratio $P_{loss}/P_{in}$ and a frequency in the second composite electromagnetic-wave-absorbing sheet of Example 1.
Figure 38:
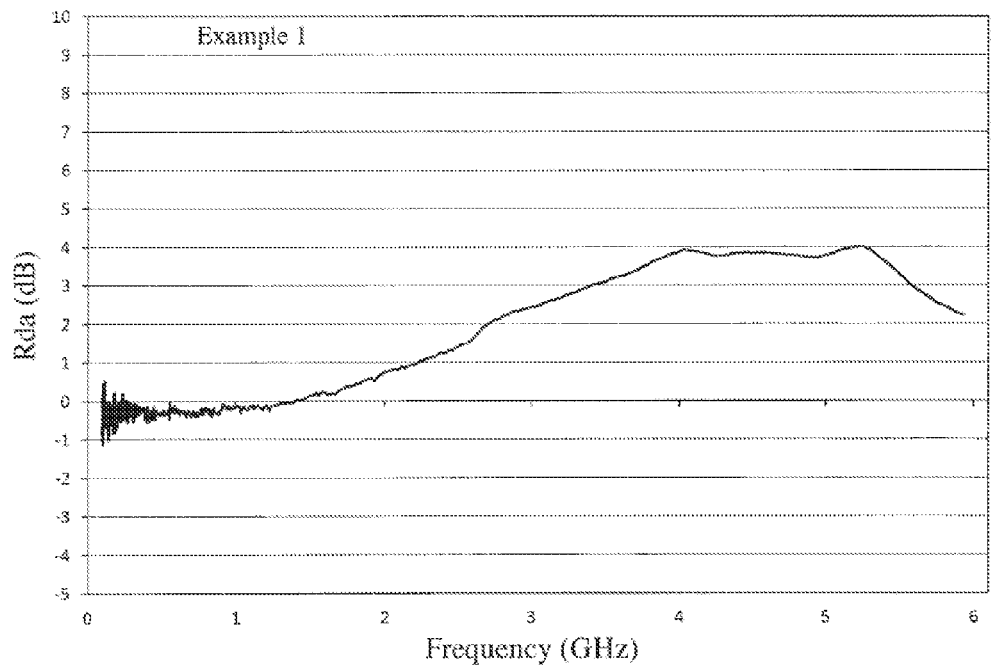
FIG. 38 is a graph showing the relation between an intra-decoupling ratio Rda and a frequency in the second composite electromagnetic-wave-absorbing sheet of Example 1.
Figure 39:
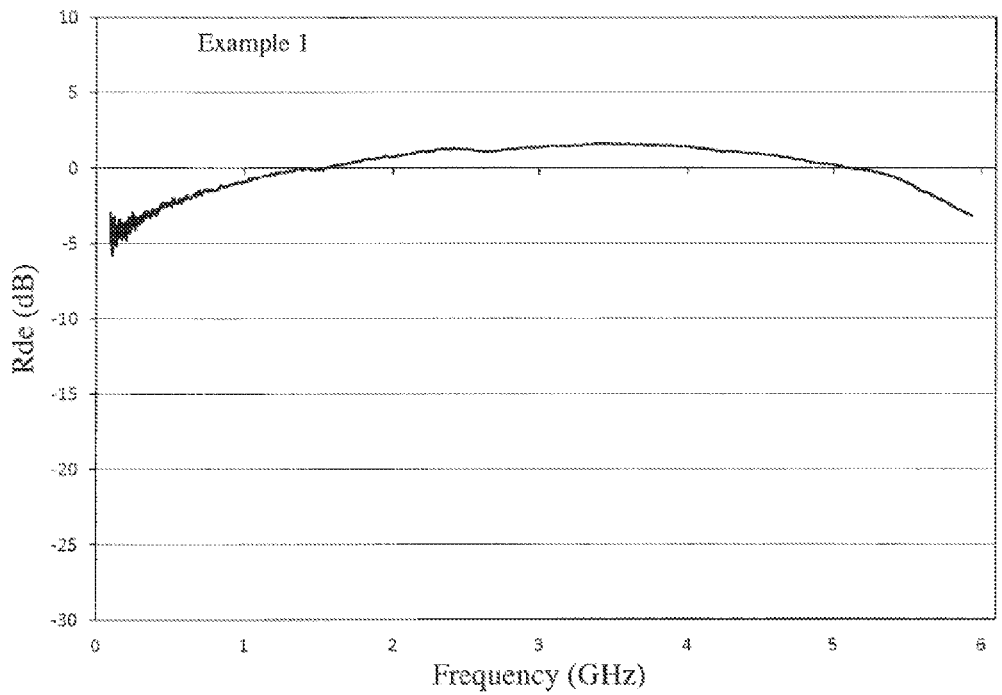
FIG. 39 is a graph showing the relation between an inter-decoupling ratio Rde and a frequency in the second composite electromagnetic-wave-absorbing sheet of Example 1.
Figure 40:
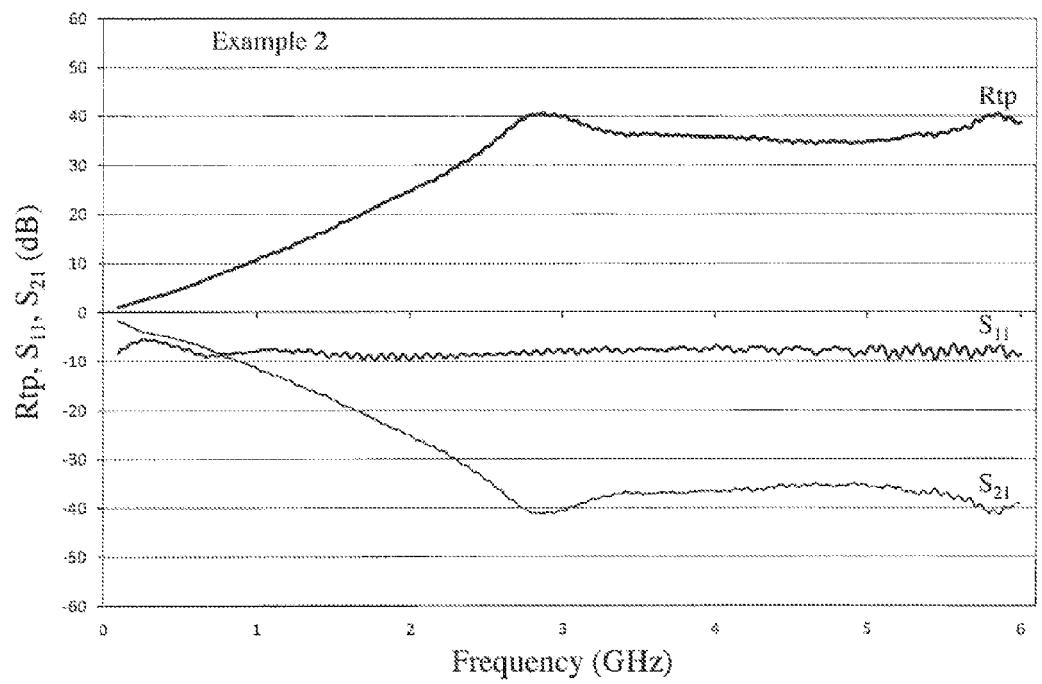
FIG. 40 is a graph showing the relation between a transmission attenuation power ratio Rtp, $S_{11}$ and $S_{21}$ and a frequency in the first composite electromagnetic-wave-absorbing sheet of Example 2.
Figure 41:
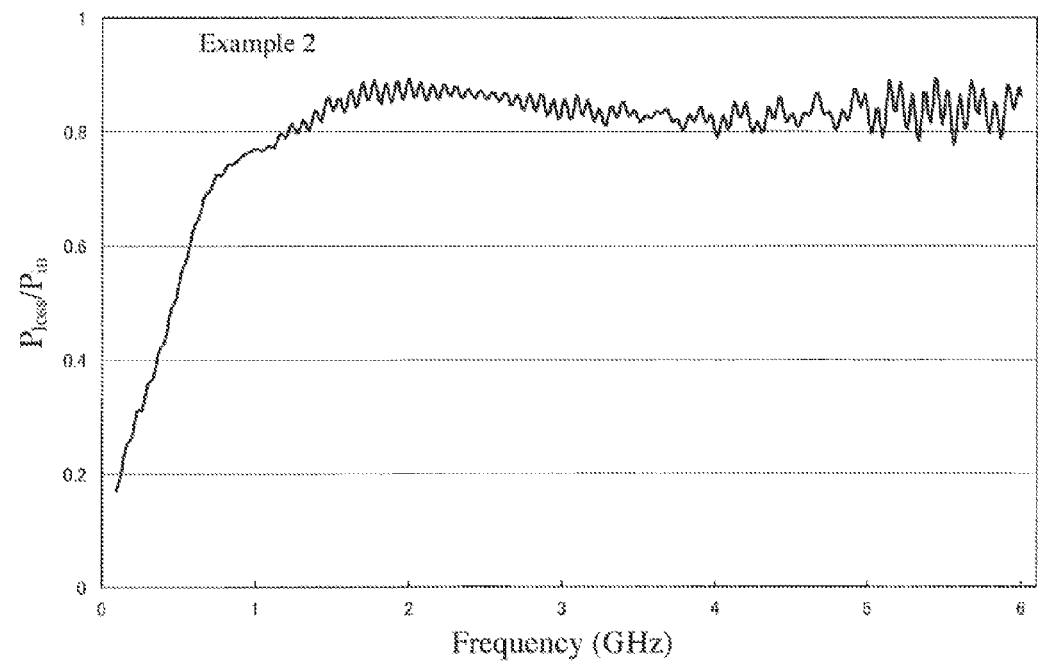
FIG. 41 is a graph showing the relation between a noise absorption ratio $P_{loss}/P_{in}$ and a frequency in the first composite electromagnetic-wave-absorbing sheet of Example 2.
Figure 42:
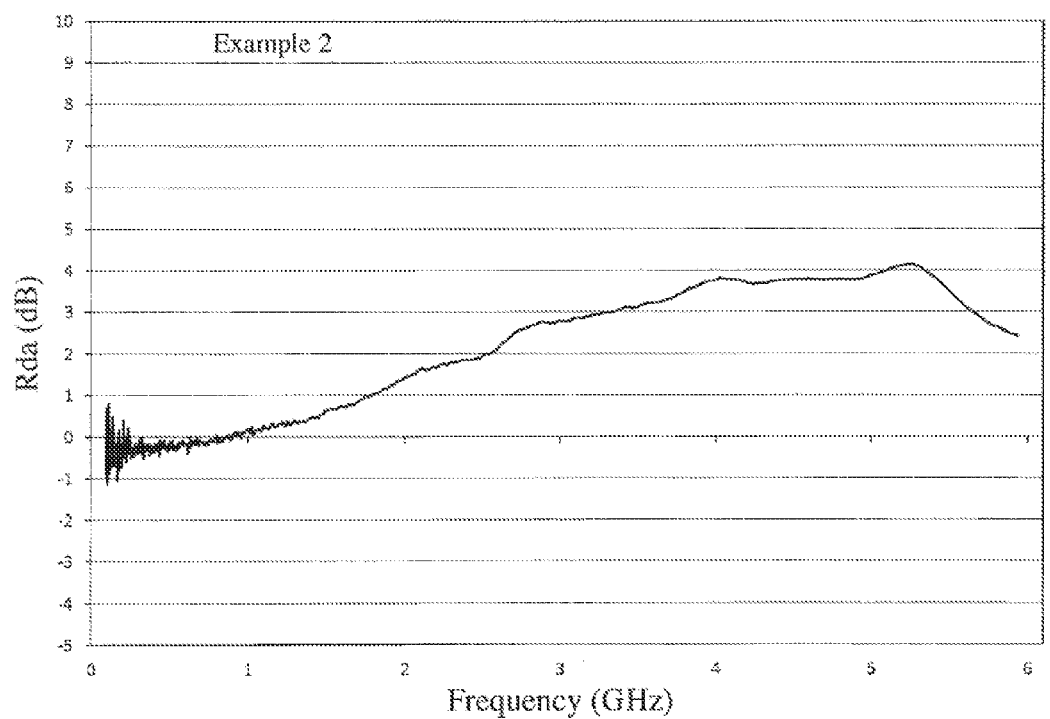
FIG. 42 is a graph showing the relation between an intra-decoupling ratio Rda and a frequency in the first composite electromagnetic-wave-absorbing sheet of Example 2.
Figure 43:
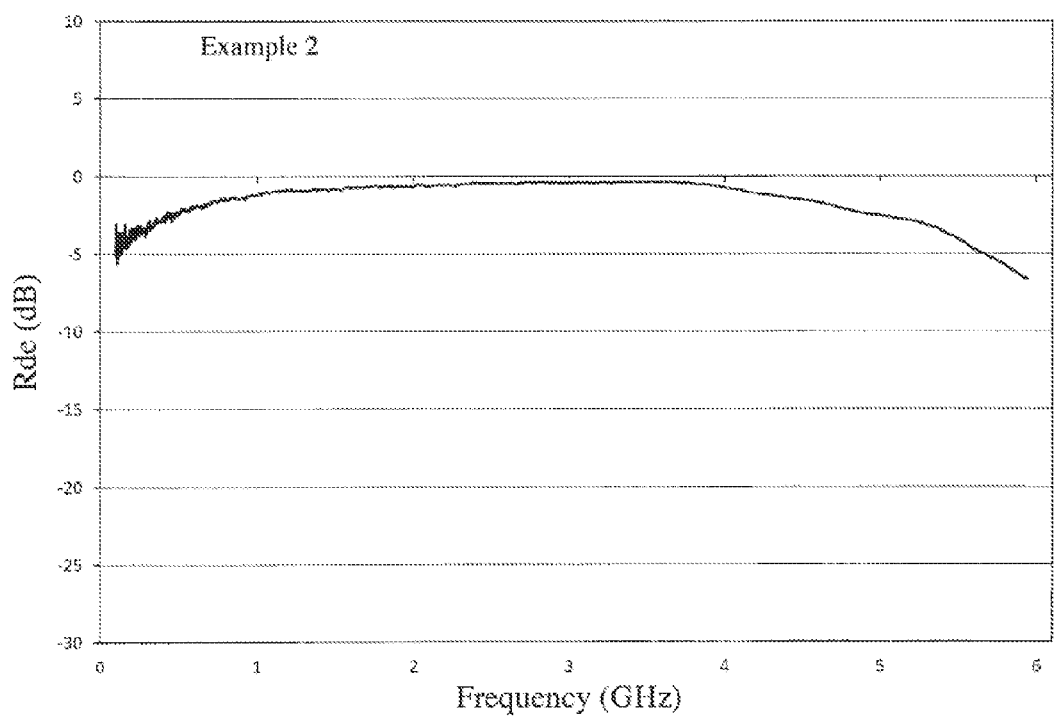
FIG. 43 is a graph showing the relation between an inter-decoupling ratio Rde and a frequency in the first composite electromagnetic-wave-absorbing sheet of Example 2.
Figure 44:
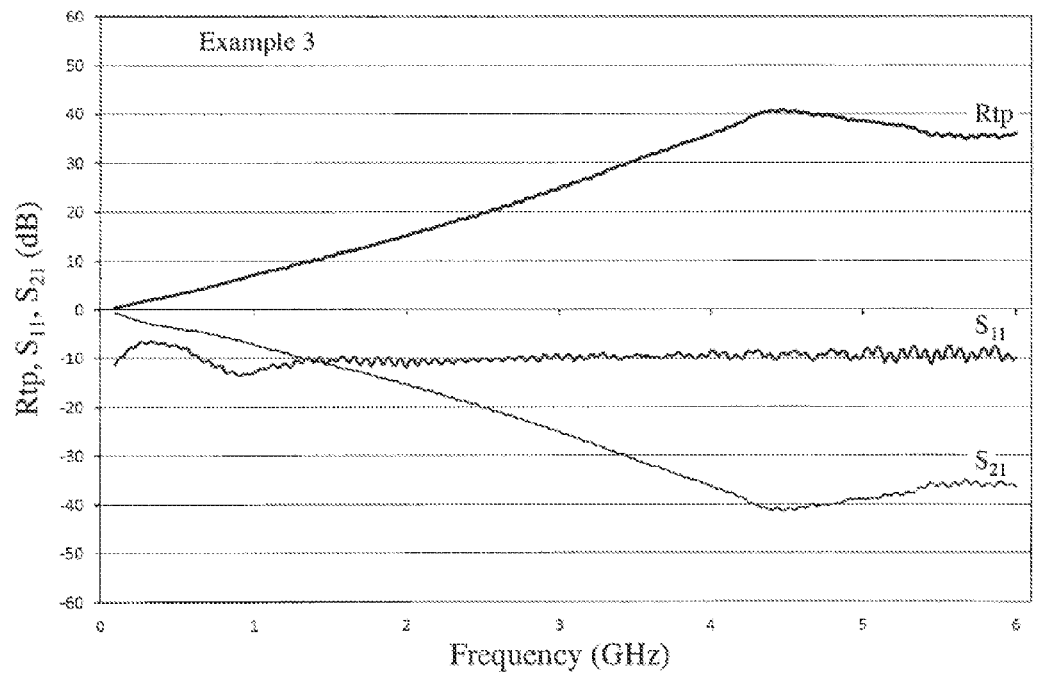
FIG. 44 is a graph showing the relation between a transmission attenuation power ratio Rtp, $S_{11}$ and $S_{21}$ and a frequency in the third composite electromagnetic-wave-absorbing sheet of Example 3.
Figure 45:
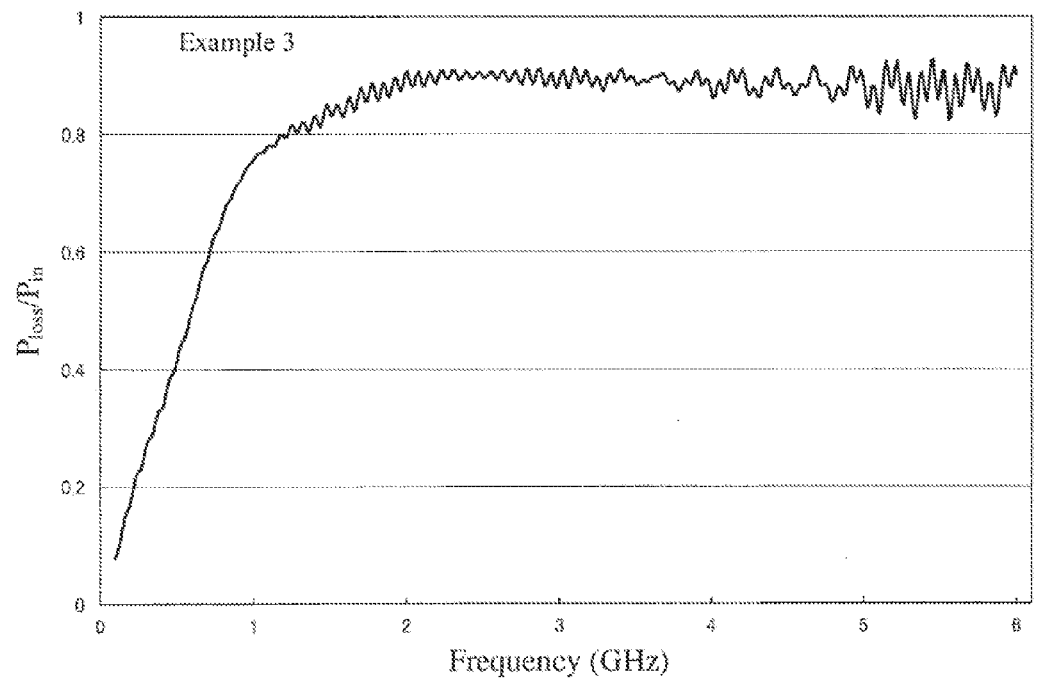
FIG. 45 is a graph showing the relation between a noise absorption ratio $P_{loss}/P_{in}$ and a frequency in the third composite electromagnetic-wave-absorbing sheet of Example 3.
Figure 46:
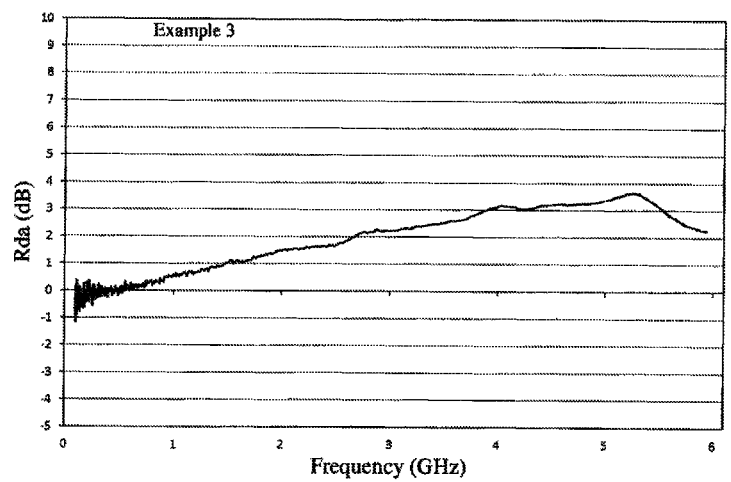
FIG. 46 is a graph showing the relation between an intra-decoupling ratio Rda and a frequency in the third composite electromagnetic-wave-absorbing sheet of Example 3.
Figure 47:
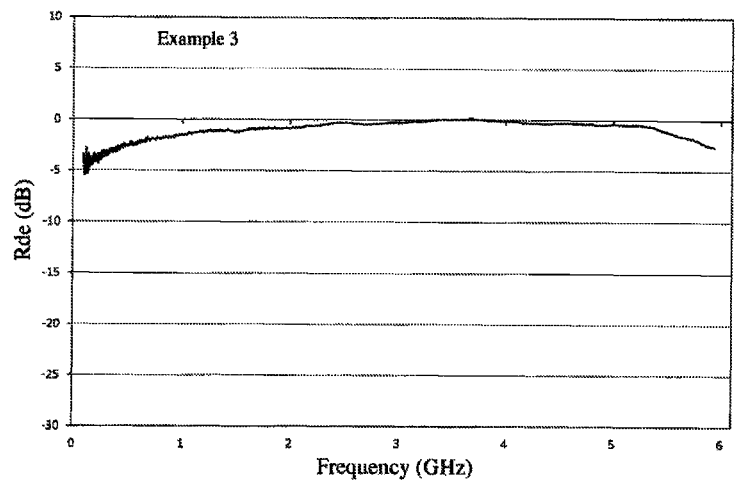
FIG. 47 is a graph showing the relation between an inter-decoupling ratio Rde and a frequency in the third composite electromagnetic-wave-absorbing sheet of Example 3.

With a test piece TP of the fourth electromagnetic-wave-absorbing film 10c disposed on each of the apparatus shown in FIG. 17 and the apparatus shown in FIG. 18, attenuation ratios were measured when high-frequency signals of 0-6 GHz were transmitted from one loop antenna 301 to another loop antenna 302, to determine its intra-decoupling ratio Rda and inter-decoupling ratio Rde. The intra-decoupling ratio Rda and the inter-decoupling ratio Rde in a frequency range of 0-6 GHz are shown in FIGS. 26 and 27, respectively.

Comparative Example 1

Using a commercially available 0.1-mm-thick magnetic noise suppression sheet containing ferrite particles (BUSTERADE available from NEC TOKIN Corporation) as the second electromagnetic-wave-absorbing film 20, the transmission attenuation power ratio Rtp and the noise absorption ratio $P_{loss}/P_{in}$ in a frequency range of 0.1-6 GHz, and the intra-decoupling ratio Rda, and the inter-decoupling ratio Rde in a frequency range of 0-6 GHz were respectively measured. The results are shown in FIGS. 28-31, respectively.

Comparative Example 2

Using a 0.2-mm-thick, carbon-containing, conductive noise suppression sheet as the second electromagnetic-wave-absorbing film 20, the transmission attenuation power ratio Rtp and the noise absorption ratio $P_{loss}/P_{in}$ in a frequency range of 0.1-6 GHz, and the intra-decoupling ratio Rda and the inter-decoupling ratio Rde in a frequency range of 0-6 GHz were respectively measured. The results are shown in FIGS. 32-35, respectively.

Example 1

The third electromagnetic-wave-absorbing film 10b obtained in Reference Example 1 was adhered to a commercially available, 0.1-mm-thick magnetic noise suppression sheet containing ferrite particles (BUSTERADE available from NEC TOKIN Corporation) as the second electromagnetic-wave-absorbing film 20, to obtain the second composite electromagnetic-wave-absorbing sheet 1b shown in FIG. 2. With respect to the second composite electromagnetic-wave-absorbing sheet 1b, the transmission attenuation power ratio Rtp and the noise absorption ratio $P_{loss}/P_{in}$ in a frequency range of 0.1-6 GHz, and the intra-decoupling ratio Rda and the inter-decoupling ratio Rde in a frequency range of 0-6 GHz are shown in FIGS. 36-39, respectively. As is clear from FIGS. 36-39, the second composite electromagnetic-wave-absorbing sheet 1b of Example 1 constituted by the third electromagnetic-wave-absorbing film 10b and the magnetic noise suppression sheet 20 had better electromagnetic wave absorbability than those of the third electromagnetic-wave-absorbing film 10b alone (Reference Example 1) and the second electromagnetic-wave-absorbing film 20 alone (Comparative Example 1).

Example 2

Using an apparatus having the structure shown in FIG. 12, which comprised pattern rolls 32a, 32b having fine diamond particles having a particle size distribution of 50-80 μm electro-deposited on the surface, linear scratches 122a', 122b' were formed in two perpendicular directions as shown in FIG. 5(c) on a 0.05-μm-thick aluminum film 12, which was formed on a surface of a 16-μm-thick biaxially stretched polyethylene terephthalate (PET) film 11 by a vacuum vapor deposition method, thereby producing a first electromagnetic-wave-absorbing film 10a. It was found from the optical photomicrograph of the linearly scratched thin aluminum film 12 that the linear scratches 122a', 122b' had the following characteristics.

Range of widths W: 0.5-5 μm,
Average width Wav: 2 μm,
Range of intervals I: 2-30 μm,
Average interval Iav: 20 μm,
Average length Lav: 5 mm, and
Acute crossing angle θs: 90°.

This first electromagnetic-wave-absorbing film 10a was adhered to a commercially available, 0.1-mm-thick, magnetic noise suppression sheet containing ferrite particles (BUSTERADE available from NEC TOKIN Corporation) as the second electromagnetic-wave-absorbing film 20, to obtain the first composite electromagnetic-wave-absorbing sheet 1a shown in FIG. 1. With respect to the first composite electromagnetic-wave-absorbing sheet 1a, the transmission attenuation power ratio Rip and the noise absorption ratio $P_{loss}/P_{in}$ in a frequency range of 0.1-6 GHz, and the intra-decoupling ratio Rda and the inter-decoupling ratio Rde in a frequency range of 0-6 GHz are shown in FIGS. 40-43, respectively. As is clear from FIGS. 40-43, the first composite electromagnetic-wave-absorbing sheet 1a of Example 2 constituted by the first electromagnetic-wave-absorbing film 10a and the magnetic noise suppression sheet 20 had better electromagnetic wave absorbability than those of the first electromagnetic-wave-absorbing film 10a alone and the second electromagnetic-wave-absorbing film 20 alone (Comparative Example 1).

Example 3

The fourth electromagnetic-wave-absorbing film 10c obtained in Reference Example 2 was adhered to a commercially available, 0.1-mm-thick, magnetic noise suppression sheet containing ferrite particles (BUSTTERADE available from NEC TOKIN Corporation) as the second electromagnetic-wave-absorbing film 20, to obtain the third composite electromagnetic-wave-absorbing sheet 1c shown in FIG. 3. With respect to the third composite electromagnetic-wave-absorbing sheet 1c, the transmission attenuation power ratio Rtp and the noise absorption ratio $P_{loss}/P_{in}$ in a frequency range of 0.1-6 GHz, and the intra-decoupling ratio Rda and the inter-decoupling ratio Rde in a frequency range of 0-6 GHz are shown in FIGS. 44-47, respectively. As is clear from FIGS. 44-47, the third composite electromagnetic-wave-absorbing sheet 1c of Example 3 constituted by the fourth electromagnetic-wave-absorbing film 10c and the magnetic noise suppression sheet 20 had better electromagnetic wave absorbability than those of the fourth electromagnetic-wave-absorbing film 10c alone (Reference Example 2) and the second electromagnetic-wave-absorbing film 20 alone (Comparative Example 1).

Effects of the Invention

Because the electromagnetic wave-absorbing sheet of the present invention is constituted by a combination comprising (a-1) a first electromagnetic-wave-absorbing film comprising a plastic film and a single- or multi-layer thin metal film formed on at least one surface of the plastic film, the thin metal film being provided with large numbers of substantially parallel, intermittent, linear scratches with irregular widths and irregular intervals in plural directions, (a-2) a third electromagnetic-wave-absorbing film having a thin carbon nanotube layer formed on the thin metal film of the first electromagnetic-wave-absorbing film, or (a-3) a fourth electromagnetic-wave-absorbing film obtained by forming a thin magnetic metal film on at least one surface of a plastic film by a vapor deposition method, and then heat-treating it at a temperature in range of 110-180° C., the thin magnetic metal film having light transmittance of 3-50% to a laser ray having wavelength of 660 nm, and the thin magnetic metal film having surface resistance of 10-200 Ω/square when measured under a load of 3.85 kg applied via a flat pressure plate, with a pair of electrodes each having a length completely covering a side of the test piece disposed on opposing side portions of the thin magnetic metal film of a square test piece of 10 cm×10 cm cut out of the fourth electromagnetic-wave-absorbing film, and (b) a second electromagnetic-wave-absorbing film composed of a resin or a rubber in which magnetic particles or non-magnetic, conductive particles are dispersed, it can exhibit high electromagnetic wave absorbability in a wide frequency range, which cannot be achieved by each of the first to fourth electromagnetic-wave-absorbing films alone, even though it is thin. The thin, composite electromagnetic-wave-absorbing sheet of the present invention having such advantages are suitable for various communications apparatuses and electronic apparatuses required to be small, light in weight and low in cost.

What is claimed is:

1. A composite electromagnetic-wave-absorbing sheet having improved uniformity of electromagnetic wave absorbability, comprising;
    (a) a first electromagnetic-wave-absorbing film comprising a plastic film, and a single- or multi-layer thin metal film formed on at least one surface of the plastic film, said thin metal film being provided with a plurality of substantially parallel, intermittent, linear scratches with irregular widths and irregular intervals in plural directions;
    (b) a second electromagnetic-wave-absorbing film comprising a resin or a rubber in which magnetic particles or non-magnetic, conductive particles are dispersed; and
    a thin carbon nanotube layer having a thickness (expressed by a coated amount) of 0.01-0.5 g/m² formed on the thin metal film of said first electromagnetic-wave-absorbing film.

2. The composite electromagnetic-wave-absorbing sheet according to claim 1, wherein said linear scratches are oriented in two directions with a crossing angle of 30-90°.

3. The composite electromagnetic-wave-absorbing sheet according to claim 1, wherein said linear scratches have widths in a range of 0.1-100 μm for 90% or more and 1-50 μm on average, and transverse intervals in a range of 1-500 μm and 1-200 μm on average.

4. The composite electromagnetic-wave-absorbing sheet according to claim 1, wherein said thin metal film is made of at least one metal selected from the group consisting of aluminum, copper, silver, tin, nickel, cobalt, chromium and alloys thereof.

5. The composite electromagnetic-wave-absorbing sheet according to claim 1, wherein the amount of said magnetic particles or said non-magnetic, conductive particles in said second electromagnetic-wave-absorbing film is 10-60% by volume.

6. The composite electromagnetic-wave-absorbing sheet according to claim 1, wherein said magnetic particles or said non-magnetic, conductive particles have an average particle size of 5-200 μm.

7. The composite electromagnetic-wave-absorbing sheet according to claim 1, wherein said non-magnetic, conductive particles are particles of a non-magnetic metal or carbon.

* * * * *